(12) United States Patent
Fite et al.

(10) Patent No.: US 6,826,970 B2
(45) Date of Patent: Dec. 7, 2004

(54) METHOD AND APPARATUS FOR DETECTING BEARING FAILURE

(75) Inventors: Robert J. Fite, Olympia, WA (US); Donovan D. Van Sleet, Spanaway, WA (US); Casey R. Winkel, Olympia, WA (US); Eyran Eylon, Olympia, WA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/437,018

(22) Filed: May 8, 2003

(65) Prior Publication Data

US 2004/0045375 A1 Mar. 11, 2004

Related U.S. Application Data

(62) Division of application No. 10/038,538, filed on Jan. 2, 2002.

(51) Int. Cl.[7] .................................................. G01L 1/22
(52) U.S. Cl. ..................................................... 73/862.338
(58) Field of Search ..................... 73/862.338, 862.339, 73/862.337, 774, 781, 788, 794, 795

(56) References Cited

U.S. PATENT DOCUMENTS

| | | | |
|---|---|---|---|
| 4,168,160 A | * 9/1979 | Stoferle et al. | .......... 73/862.49 |
| 4,278,881 A | 7/1981 | Mann | |
| 4,434,389 A | 2/1984 | Langley et al. | |
| 4,544,039 A | * 10/1985 | Crane | .......................... 173/182 |
| 4,550,617 A | * 11/1985 | Fraignier et al. | ...... 73/862.042 |
| 4,618,806 A | 10/1986 | Grouse | |
| 4,803,885 A | * 2/1989 | Nonomura et al. | .... 73/862.333 |
| 4,865,143 A | * 9/1989 | Hashimoto et al. | ......... 180/443 |
| 5,258,676 A | 11/1993 | Reinhardt et al. | |
| 5,572,403 A | 11/1996 | Mills | |
| 6,257,065 B1 | * 7/2001 | Kyrtsos | ....................... 73/654 |

FOREIGN PATENT DOCUMENTS

| | | |
|---|---|---|
| DE | 29 47 937 A1 | 11/1981 |
| DE | 43 04 818 A1 | 8/1994 |
| WO | WO 83/04436 | 12/1983 |
| WO | WO 94/14226 | 6/1994 |

OTHER PUBLICATIONS

PCT International Search Report dated Aug. 20. 2003 related to International Application No. PCT/US 02/41553 (9 pp.).

* cited by examiner

*Primary Examiner*—Max Noori
(74) *Attorney, Agent, or Firm*—Blakely, Sokoloff, Taylor & Zafman LLP

(57) ABSTRACT

A device is presented having an optical emitter/receiver device. The device has a light pipe connected with the optical emitter/receiver device. Also a rotating shaft having at least one opening. The light pipe is situated within the rotating shaft. At least one bearing having a reflective marker is connected to the shaft.

14 Claims, 20 Drawing Sheets

METHOD AND APPARATUS FOR DETECTING BEARING FAILURE

RELATED APPLICATION

The application is a divisional of U.S. patent application, Ser. No. 10/038,538, filed Jan. 2, 2002, by Applicants, Robert J. Fite, Donovan D. Van Sleet, Casey R. Winkel and Eyran Eylon, and entitled "Method and Apparatus for Detecting Bearing Failure."

BACKGROUND OF THE INVENTION

1. Field of the Invention

This invention relates to bearings, and more particularly to a method and apparatus for detecting bearing failure.

2. Description of the Related Art

As electronic devices, such as microprocessors, central processing units (CPUs), servers, and other similar types of electronic components become faster and are reduced in size, power consumed within the system per unit volume (power density) increases dramatically. Therefore, it is essential to dissipate the heat generated by electronic components within the system during its operation to keep the electronic components within their normal operating temperature ranges. If the electronic components operate outside of their operating temperature ranges, the life span of the electronic components will be reduced or fail immediately.

One effective technique for dissipating the heat from electronic components, such as a microprocessor, is to provide an internal fan, or fan assembly, to directly apply a relatively high-velocity air stream across the surface of the electronic components. By forcing high-velocity air across the surface of the internal component(s), the conductive heat transfer coefficient for the surface of the internal electronic components is increased, thus increasing the convection cooling. Another technique of dissipating the heat from an electronic component, such as a microprocessor CPU, is associating a heat sink with the microprocessor CPU to increase the heat-dissipating surface area of the CPU for more effective cooling. These heat sinks have multiple heat-dissipating fins or elements at an upper surface. A lower surface of the heat sink is coupled to the electronic component and attached with a retention clip. Since the heat sink is comprised of metal or metal alloys, the heat sink conducts heat away from the microprocessor CPU and allows convection cooling through the fins.

One method to achieve cooling on devices such as microprocessors is to add additional fans by placing fans in parallel and in series. A problem with this method of cooling is that if one fan fails, the remaining fan must force air through an inoperable fan. Upon forcing air through an inoperable fan, fan speed must be increased, which significantly increases noise and limits the types of fans that can be used. Single point failures often occur in motors, fans and mechanical devices. Many times, a bearing is the source of the single point failure. When a bearing fails in a fan, the motor or electronics subsequently fail.

BRIEF DESCRIPTION OF THE DRAWINGS

The invention is illustrated by way of example and not by way of limitation in the figures of the accompanying drawings, in which like references indicate similar elements. It should be noted that references to "an" or "one" embodiment in this disclosure are not necessarily to the same embodiment, and such references mean at least one.

DETAILED DESCRIPTION OF THE INVENTION

The invention generally relates to a method and apparatus for fan redundancy. Referring to the figures, exemplary embodiments of the invention will now be described. The exemplary embodiments are provided to illustrate the invention and should not be construed as limiting the scope of the invention.

Figure 1:
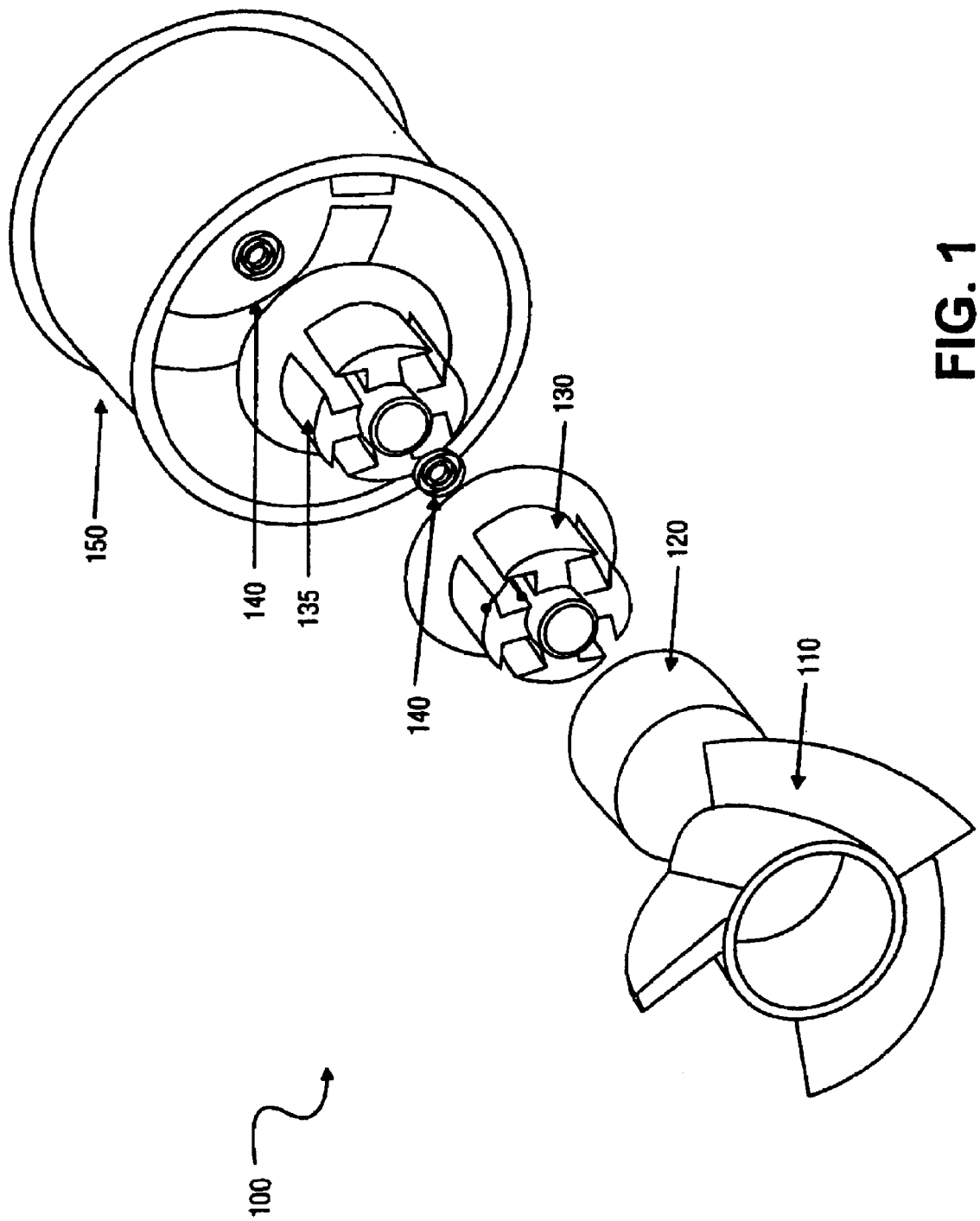
FIG. 1 illustrates an embodiment including a multiple redundant fan with in-line redundant motors.

FIG. 1 illustrates an embodiment having a single fan with multiple redundant components. Fan 100 includes fan 110, fan hub 120, fan motors 130 and 135, bearings 140 and housing 150. In one embodiment, fan 110 contains three fan blades. One should note, however, that other embodiments can vary the number of fan blades without diverging from the scope of the invention.

Figure 2:
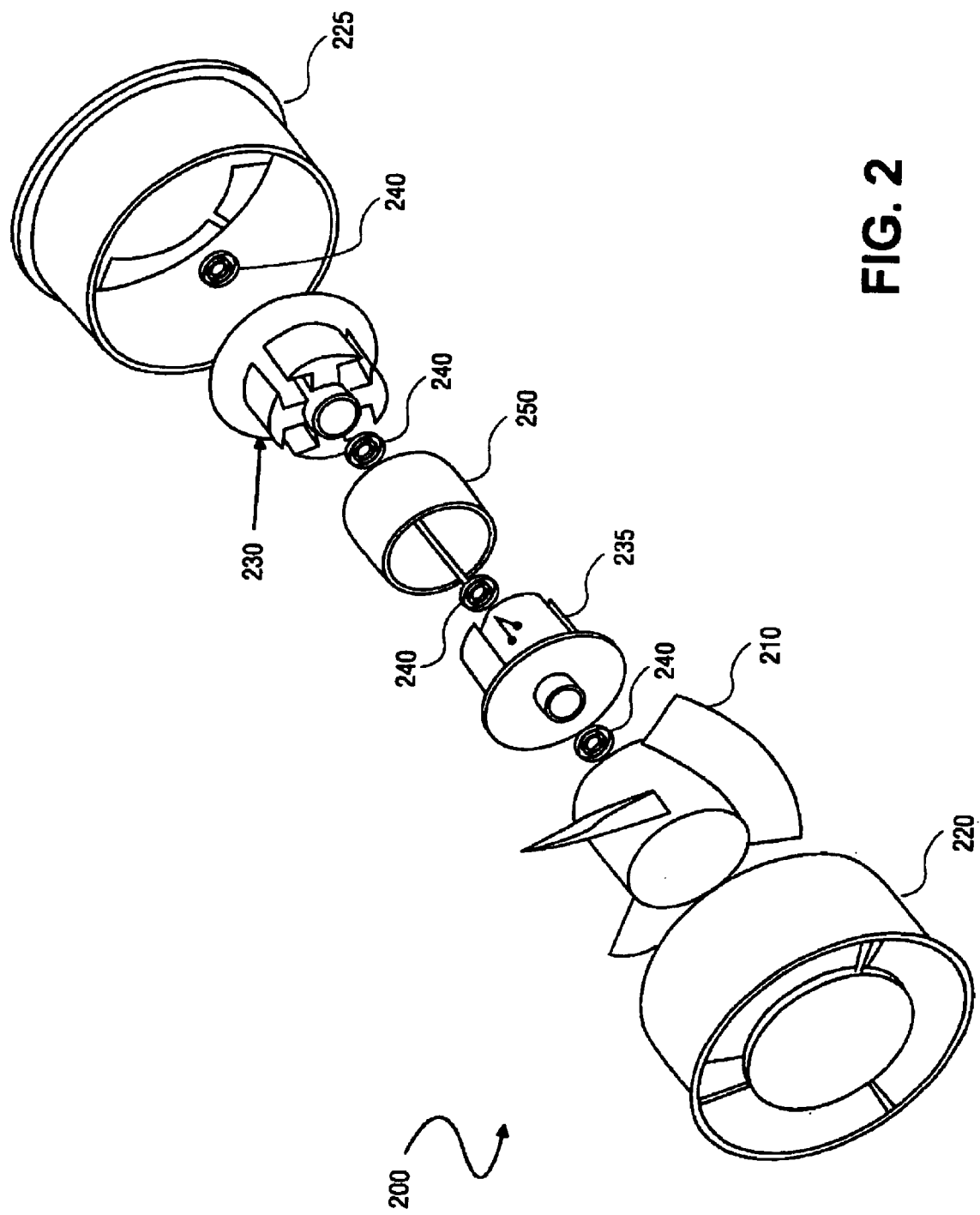
FIG. 2 illustrates an embodiment including a multiple redundant fan with opposing redundant motors.

FIG. 2 illustrates an embodiment having multiple redundant fan 200. Multiple redundant fan 200 includes fan housings 220 and 225, fan blades 210, motors 230 and 235, bearings 240 and fan hub 250. In this embodiment, fan blades 210 include three fan blades. One should note, however, that fan blades 210 can include more or less fan blades without diverging from the scope of invention.

Figure 3:
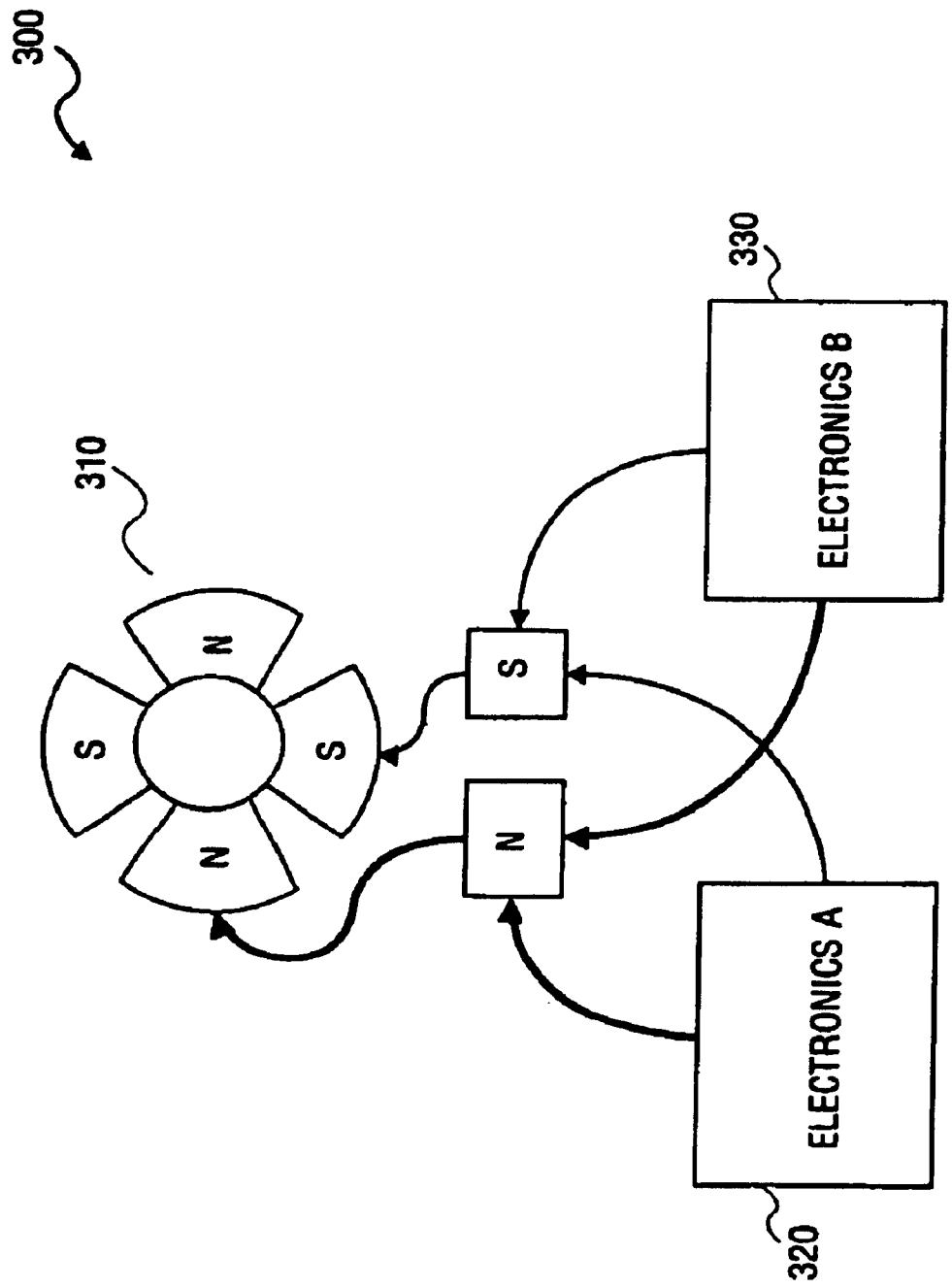
FIG. 3 illustrates an embodiment having redundant electronics.

The embodiments illustrated in FIGS. 1 and 2 will now be discussed with reference to the various components. FIG. 3 illustrates an embodiment having motor and electronics 300. In this embodiment, electronics A 320 and electronics B 330 are electrically independent sets of electronics that are structured in a parallel circuit. The windings of motor 310 are electrically connected to both sets of electronics A 320 and electronics B 330. In one embodiment, motors 130 and 135 (illustrated in FIG. 1) can each be replaced by motor 310. In another embodiment, motors 230 and 235 (illustrated in FIG. 2) can each be replaced by motor 310.

As illustrated in FIG. 3, motor 310 includes one set of windings. Both electronics A 320 and electronics B 330 include speed control for motor 310. Both electronics A 320 and electronics B 330 can use various means for controlling motor speed, such as pulse width modulation (PWM), voltage/resistance variation, or thermal speed control. Also, both electronics A 320 and electronics B 330 can use a tachometer or similar means for fan rotation feedback.

Electronics A 320 and electronics B 330 can both work together simultaneously to control motor 310's rotational speed, or can each work independently. In the case where electronics A 320 and electronics B 330 run simultaneously, the control of motor 310 is "split" between electronics A 320 and electronics B 330. In the case of failure of either electronics A 320 or electronics B 330, the non-failed electronics will continue to control motor 310 to maintain fan speed. In the case where electronics A 320 and electronics B 330 do not control motor 310 simultaneously, upon a failure of either electronics A 320 or electronics B 330, the non-failed electronics will take over and control motor 310. This can be accomplished with a simple switch, feedback and control, voltage/current detection, etc. One should note that various fan speed feedback means can be implemented with signals sent to either electronics A 320 or electronics B 330 by means such as, tachometers, light sensors, etc.

By using redundant electronics (electronics A 320 and electronics B 330) to control motor 310, motor 310 can continue to function in case of one of the electronics failing. In the case where motor 310 is used as a cooling fan for electronic components, the redundant electronics overcome the signal point failure of having a single electronics controller for motor 310. Thus, cooling of electronic components can be maintained, and acoustical noise can be limited by having a single fan blade component coupled to a redundant fan motor system (e.g., fan 100, illustrated in FIG. 1 or fan 200, illustrated in FIG. 2) when coupled with an embodiment including electronics A 320 and electronics B 330.

Figure 4:
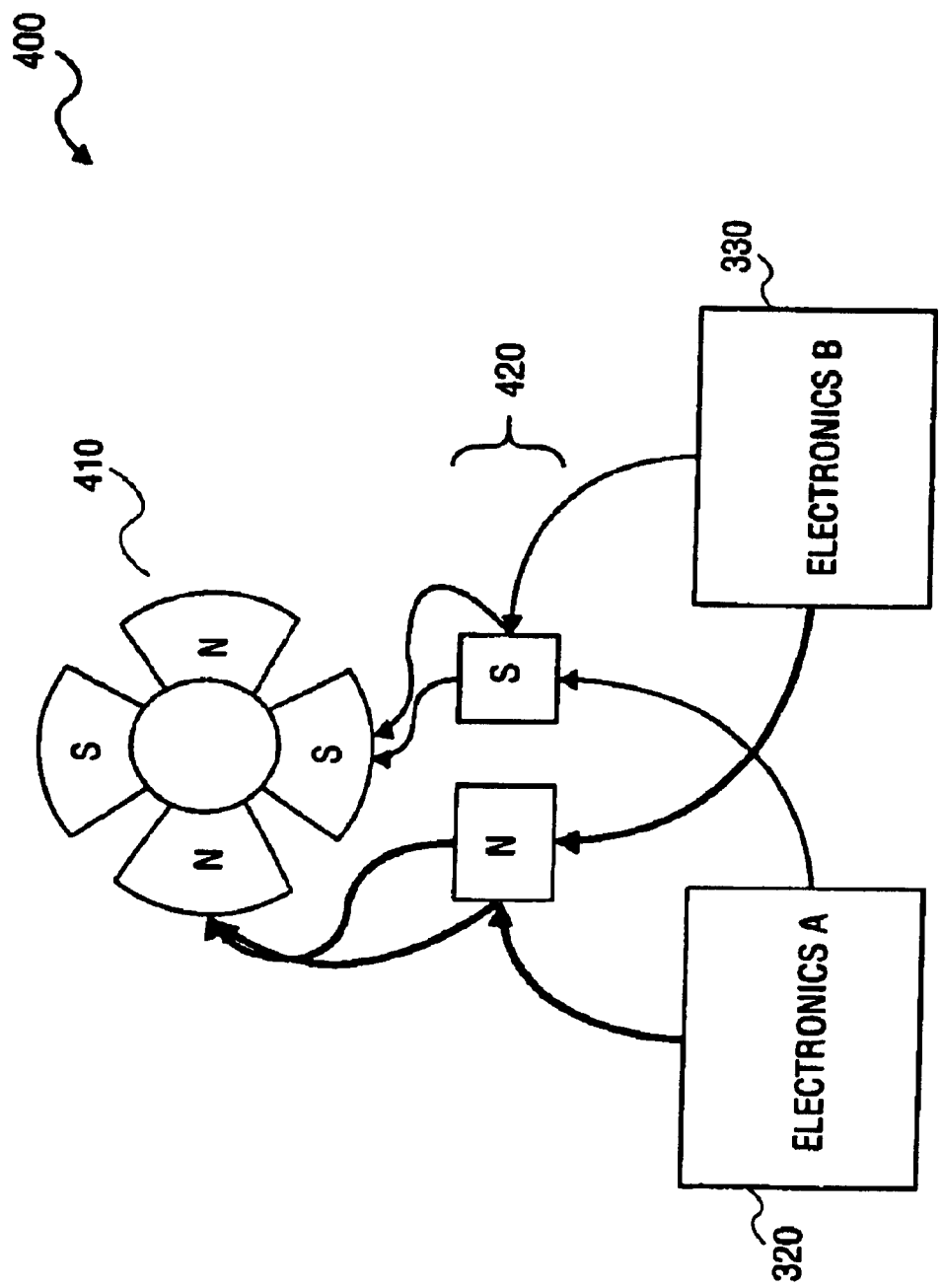
FIG. 4 illustrates an embodiment of the invention having redundant electronics coupled to a single electrical attachment pad and a motor with bifilar windings.

FIG. 4 illustrates an embodiment having motor and electronics 400. In this embodiment, motor 410 includes bifilar windings (dual redundant windings) coupled to a single electrical pad 420. One should note, however, that separate electrical pads can be coupled to motor 410 (as long as the separate electrical pads are electrically coupled similarly as to how pad 420 is coupled with the windings of motor 410, electronics A 320 and electronics B 330).

In this embodiment, if either electronics A 320 or electronics B 330, and either one of the bifilar windings fail, motor 410 continues with normal operation. Electronics A 320 and electronics B 330 are coupled in a parallel circuit structure. Also, the bifilar windings are structured in a parallel. The bifilar windings are electrically coupled to both sets of electronics, thus achieving dual fault capability.

Figure 5:
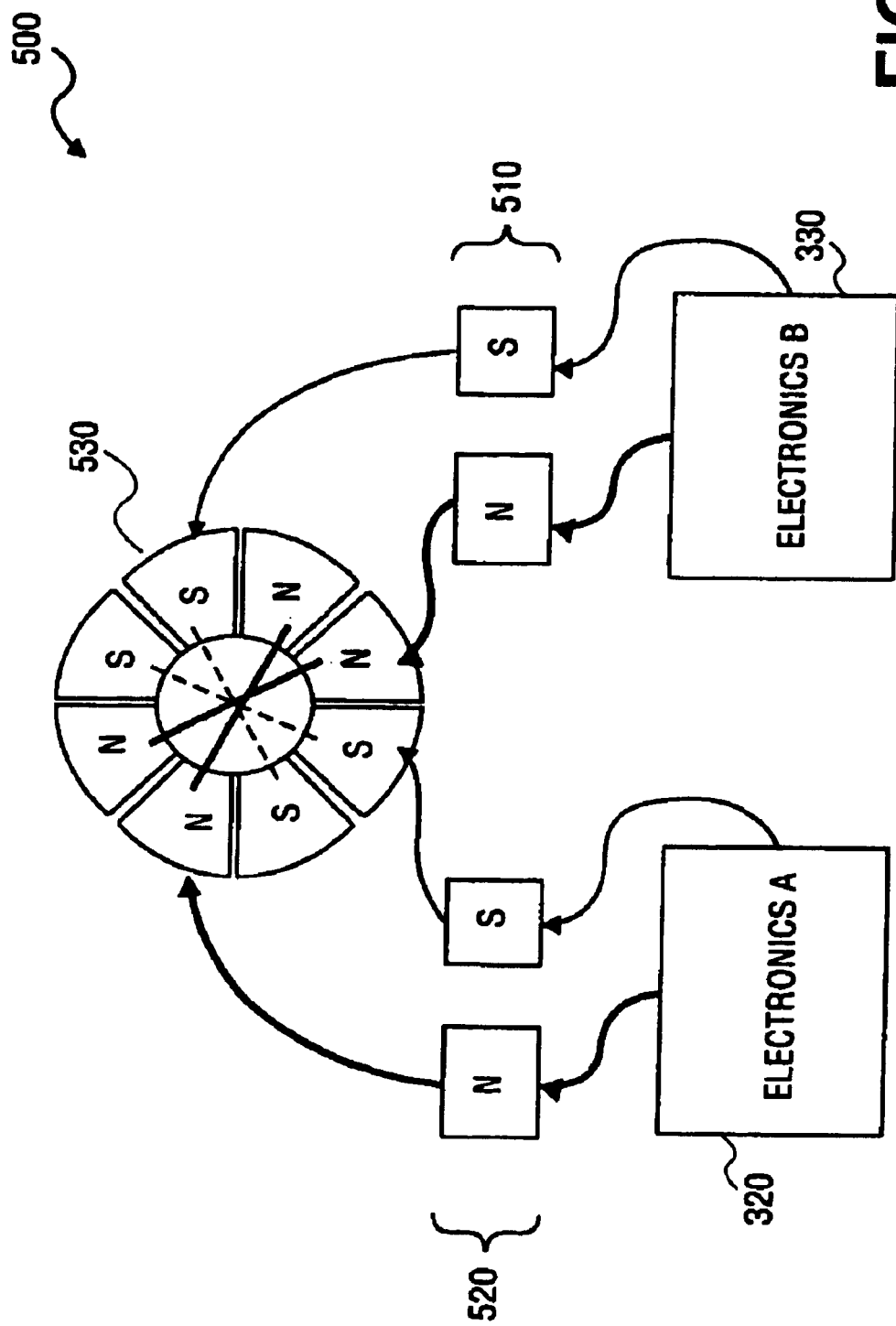
FIG. 5 illustrates one embodiment having redundant electronics and redundant magnetic lobes.

FIG. 5 illustrates an embodiment having motor and electronics 500. Motor and electronics 500 include electronics A 320, electronics B 330, first electrical pad 520, second electrical pad 510, and motor 530. Motor 530 includes two sets of independent windings on different magnetic lobes. Therefore, motor 530 includes two independent sets of winding each having four magnetic lobes. One should note, that typical motors (e.g., DC fan motors) only include four magnetic lobes. Each set of four magnetic lobes is coupled to an independent set of electronics (electronics A 320 and electronics B 330). Between electrical pad 510 and electrical pad 520 there are two north and two south poles. Therefore, in this embodiment, motor 530 achieves redundancy via electronics and windings. If either set of electronics fail, and/or either set of windings fail, motor 530 can continue to run with normal operation.

Figure 6:
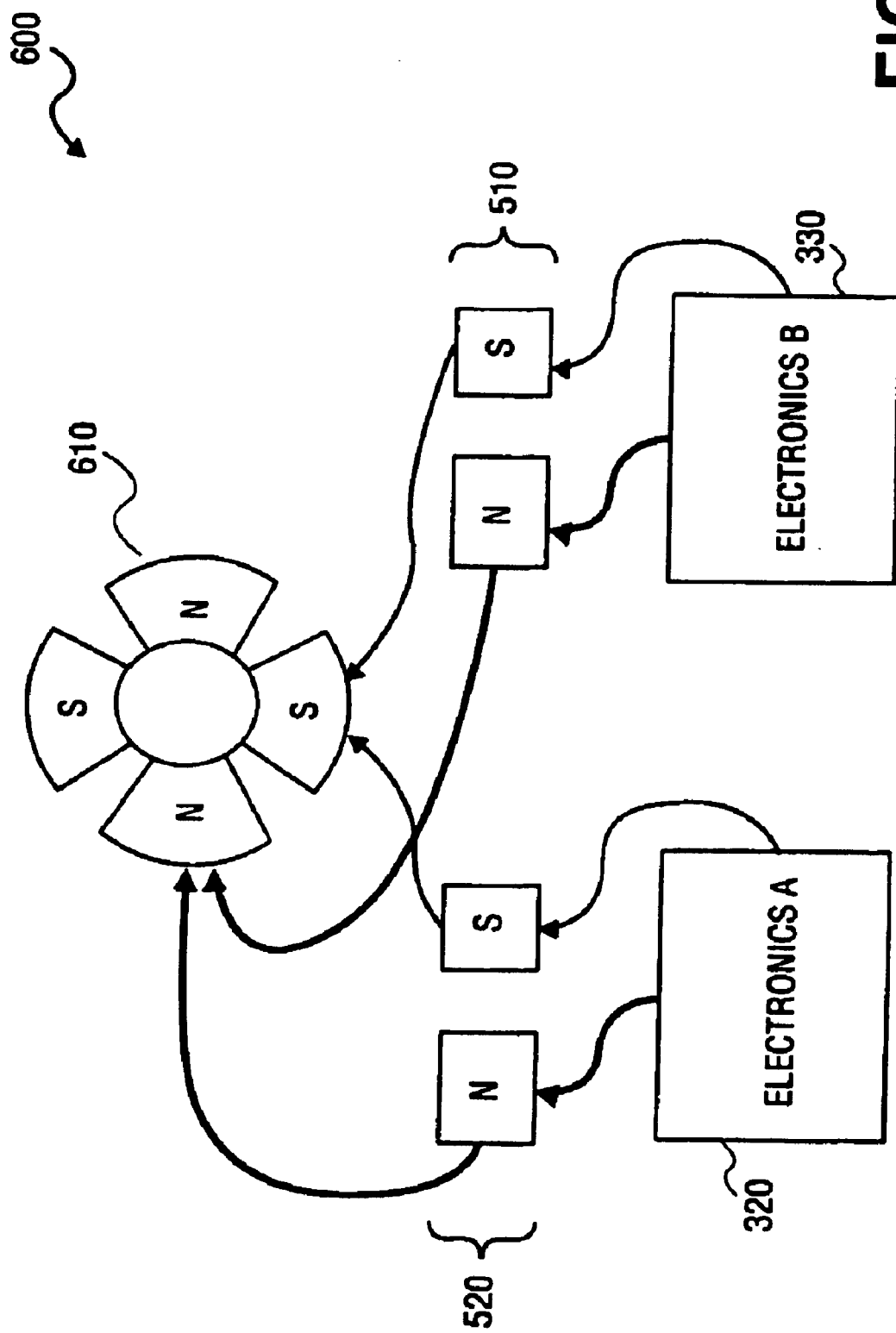
FIG. 6 illustrates an embodiment having redundant electronics coupled to two electrical attachment pads.

FIG. 6 illustrates an embodiment having motor and electronics 600. Motor and electronics 600 include motor 610, first electrical pad 510, second electrical pad 520, electronics A 320 and electronics B 330. Motor 610 includes four magnetic lobes with bifilar (dual redundant) windings. Each set of windings are coupled to a set of independent electronics (electronics A 320 and electronics B 330). In this embodiment, redundancy is achieved via electronics and/or windings. If either set of electronics or either set of windings fail, the motor will continue with normal operation.

Figure 7:
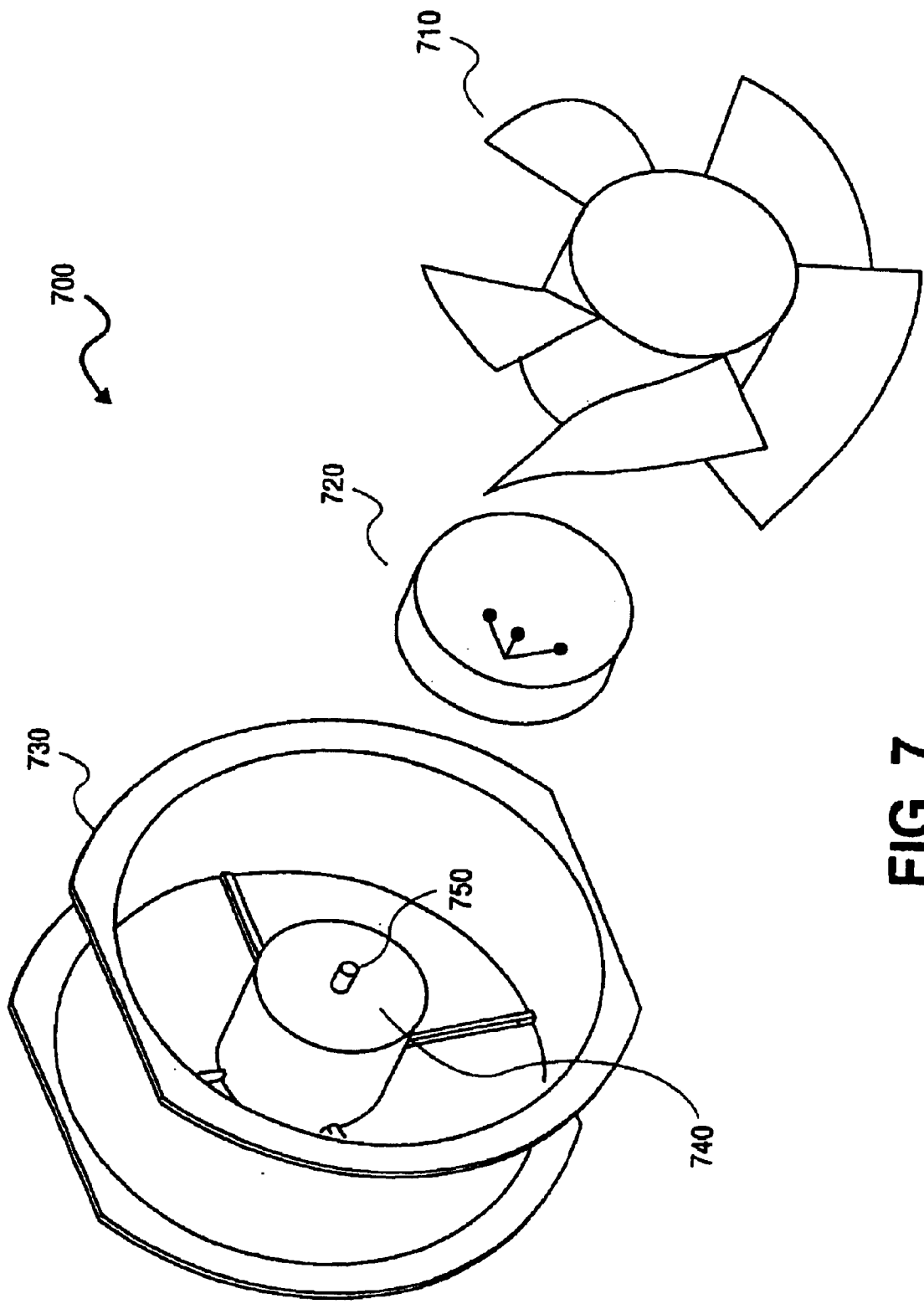
FIG. 7 illustrates an embodiment having two independent motors coupled in series.

FIG. 7 illustrates an embodiment having two independent motors coupled in series. Fan 700 includes fan blades 710, fan hub 720, fan housing 730, dual in-line motors in series 740 and shaft 750. In this embodiment, if one of the motors in series 740 fails, the non-failed motor can run fan 700 at full speed. Both in-line series motors 740 rotate in the same direction.

Figure 8:
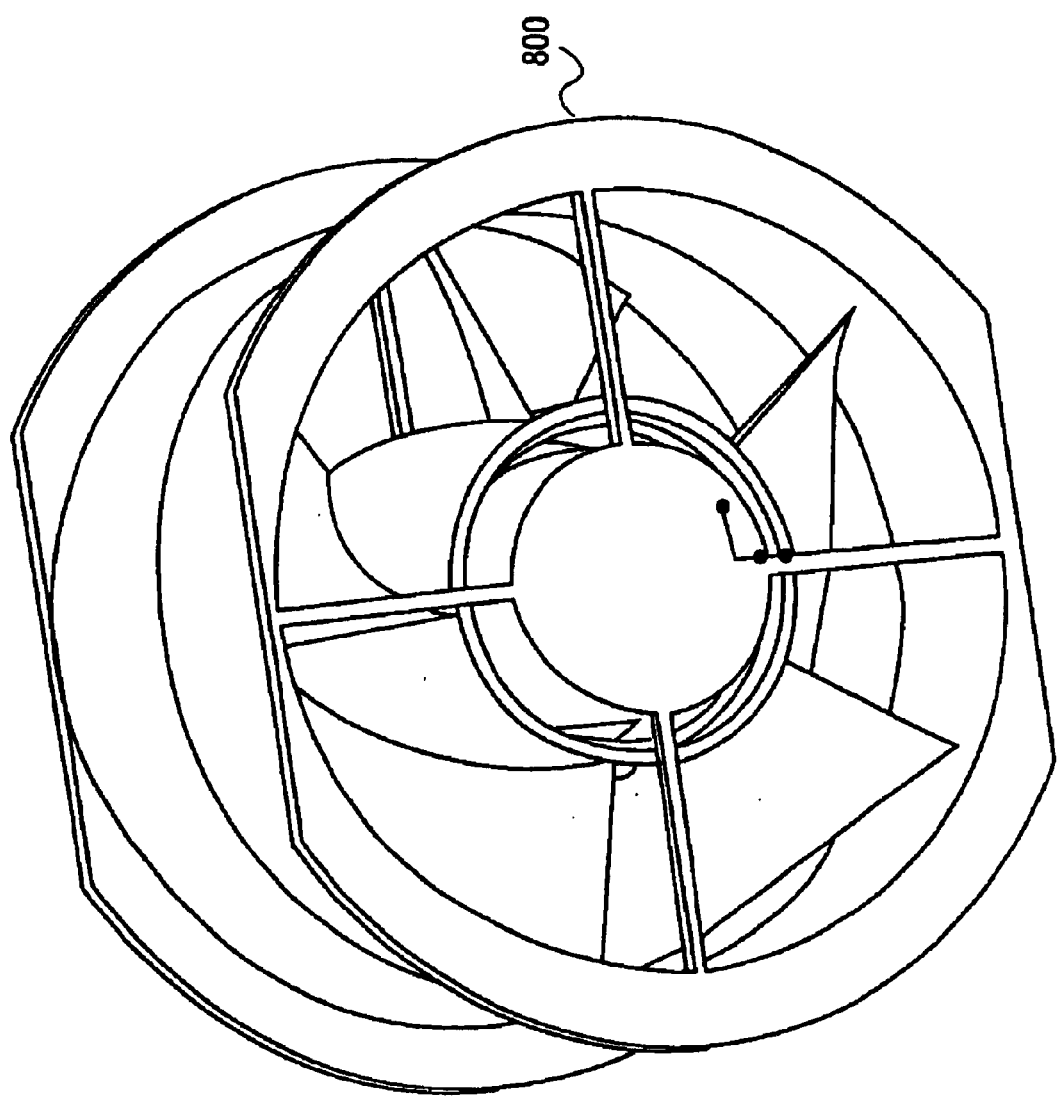
FIG. 8 illustrates a collapsed view of the embodiment illustrated in FIG. 7.

FIG. 8 illustrates a collapsed view of fan 700 illustrated in FIG. 7 (denoted 800 in FIG. 8). Fan 800 may have a thickness slightly greater than a fan having a single motor to accommodate the dual in-line series motors 740. By having two motors in series, fan 800 reduces acoustical noise, and saves space over two separately housed fans. Either of the two motors in this embodiment can be operate simultaneously or independent. If either of the motors in this embodiment operates independently, feedback sensors can trigger control electronics to switch to the other motor in series with the failed motor. In one embodiment, in-line series motors 740 can run simultaneously wherein power may be split between the two in-line series motors to achieve necessary fan speed. One should note that other redundancies can be combined with this embodiment, such as redundant electronics, electrical pads, magnetic lobes, windings, etc.

Figure 9:
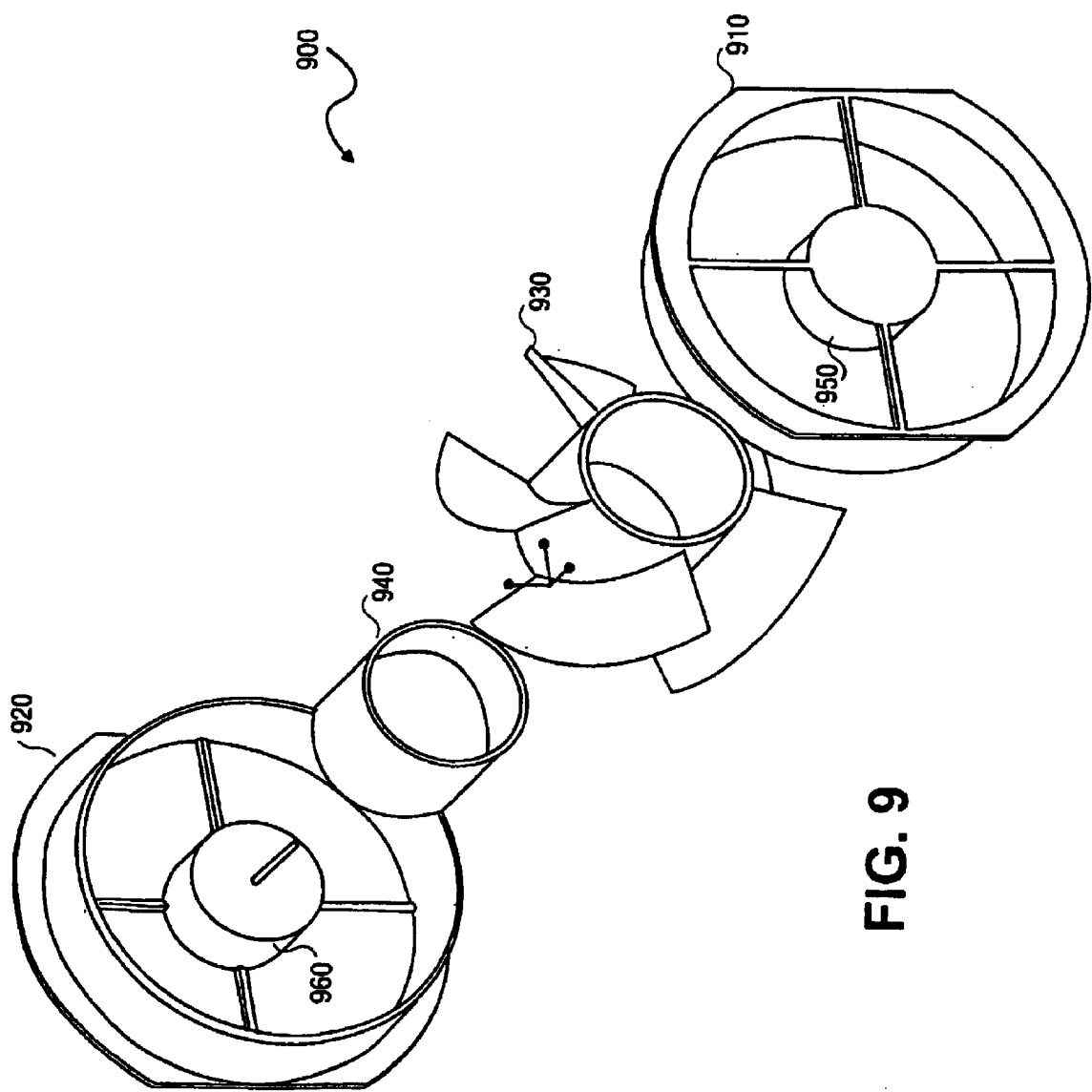
FIG. 9 illustrates an embodiment having two separate counter rotating motors with shafts attached to a common hub.
Figure 10:
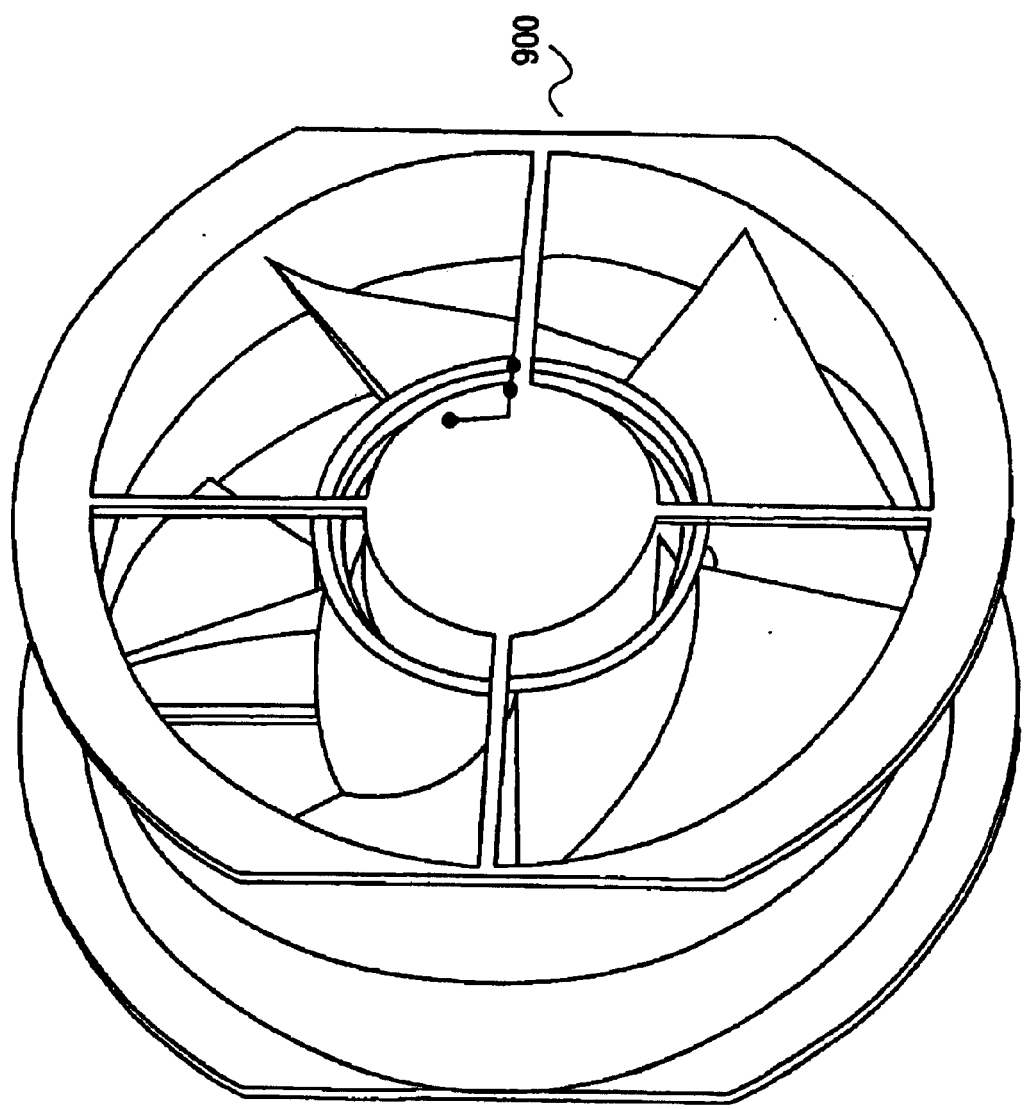
FIG. 10 illustrates a collapsed view of the embodiment illustrated in FIG. 9.

FIG. 9 illustrates an embodiment having two separate motors that rotate in the opposite direction of each other and share a common shaft. Fan 900 includes a first housing 910, a second housing 920, fan blades 930, fan hub 940, first motor 950, and second motor 960. First motor 950 and second motor 960 can run simultaneously in the opposite rotation direction over the common shaft or can run independently. In case of a failure of either motor 950 or motor 960, the non-failed motor will continue to rotate fan blades 930. In one embodiment, motor 950 and motor 960 can each run simultaneously at a lower power that would necessitate rotating fan blades 930. Upon failure in this case, the non-failed motor will have its power increased to compensate for the failed motor. By having two motors that run in the opposite rotation direction from one another, not only is space saved by not using two separate fans for redundancy, but acoustical noise is reduced by the single fan blade dual motor system. Also, when two separate fans are run in series, if one fan fails, the non-failed fan needs to push air through the failed fan. To do this, the non-failed fan would need to increase its fan speed. Thus, increasing acoustical noise. FIG. 10 illustrates a collapsed view of fan 900. One should note that other redundancies can be combined with this embodiment, such as redundant electronics, electrical pads, magnetic lobes, windings, etc.

While the presented embodiments include redundant motors, electronics, windings and/or magnetic lobes, a device, such as a direct current (DC) fan, can still have a single point of failure that is a possibility. This single point of failure possibility is the bearing. To overcome the single point failure possibility, one embodiment includes redundant bearings.

Figure 11:
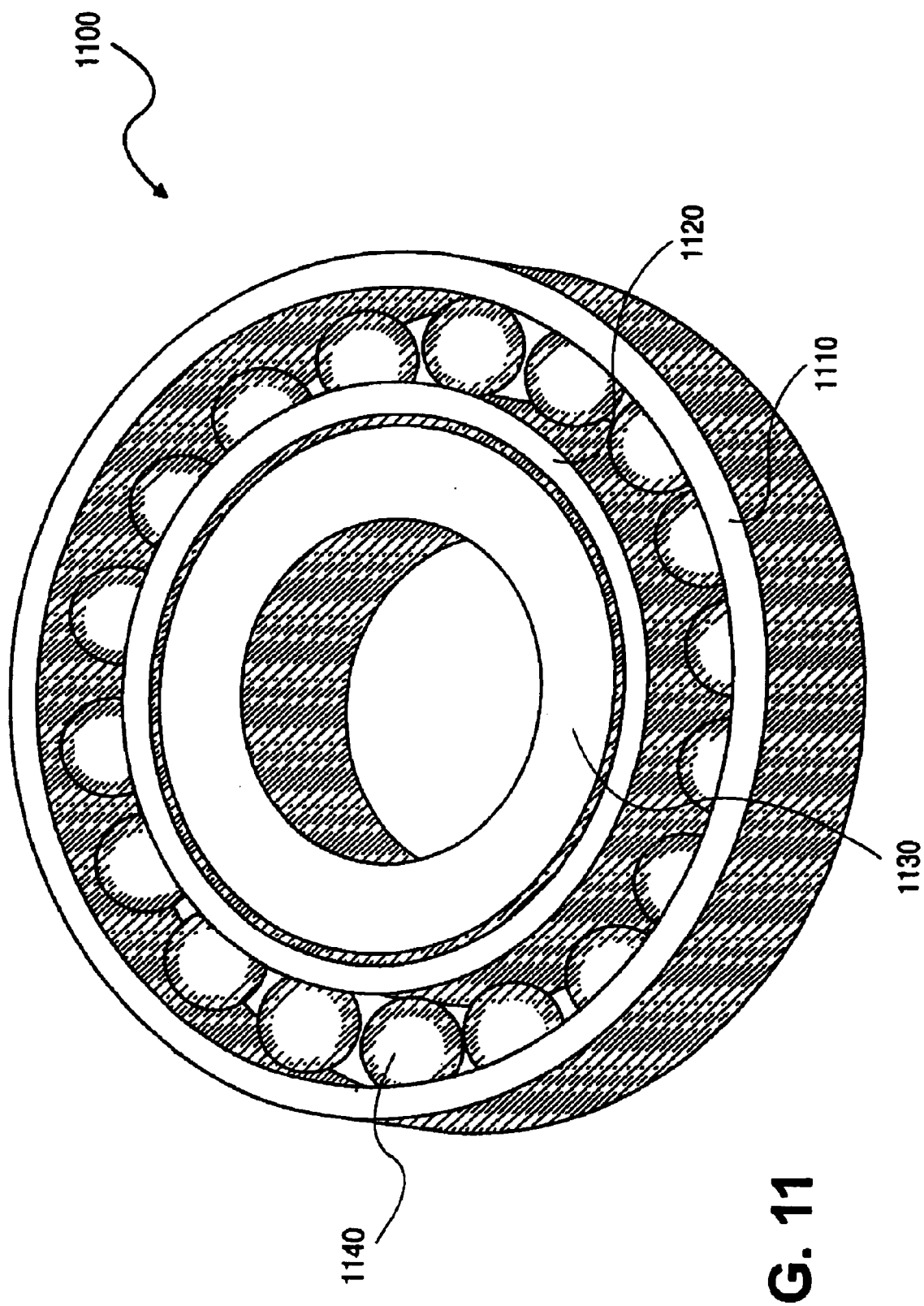
FIG. 11 illustrates an embodiment having a redundant bearing.

FIG. 11 illustrates an embodiment having a redundant bearing 1100. Redundant bearing 1100 includes outer sleeve 1110, inner sleeve 1120, inner bushing sleeve 1130 and bearing balls 1140. In this embodiment, if the ball bearing portion fails (i.e., 1110, 1120 and 1140) the sleeve bearing (i.e., 1120 and 1130) will continue with normal operation. Therefore, redundancy in the bearing is achieved. One should note that bearing balls 1140 can be replaced with other types of bearings, such as roller bearings, without diverging in scope.

When redundant bearing 1100 is used in one of the presented embodiments having multiple redundancies, such as motors, electronics, windings and/or magnetic lobes, single point failures are overcome. One should note that this embodiment can be used in other devices besides DC fans, such as alternating current (AC) motors, wheels, and other devices requiring rotation over a shaft. This embodiment can be made of various metal, metal-alloys, synthetic materials, such as hardened plastic, etc. Moreover, this embodiment can be size adjusted, depending on the device incorporating the bearing and size required due to load. Also, further redundancies, i.e., bearing sets, can be added if necessary for the application.

By having a redundant bearing incorporated within embodiments having redundant motors, fan reliability and component life are increased by reducing single point failure possibilities. Also, devices that require fan cooling can achieve fan cooling redundancy with less of a fan footprint. Moreover, acoustical noise can be reduced in devices that would typically have redundant fan systems by using embodiments having multiple redundancies, thus, reducing fan count without sacrificing fan cooling redundancy.

Figure 12:
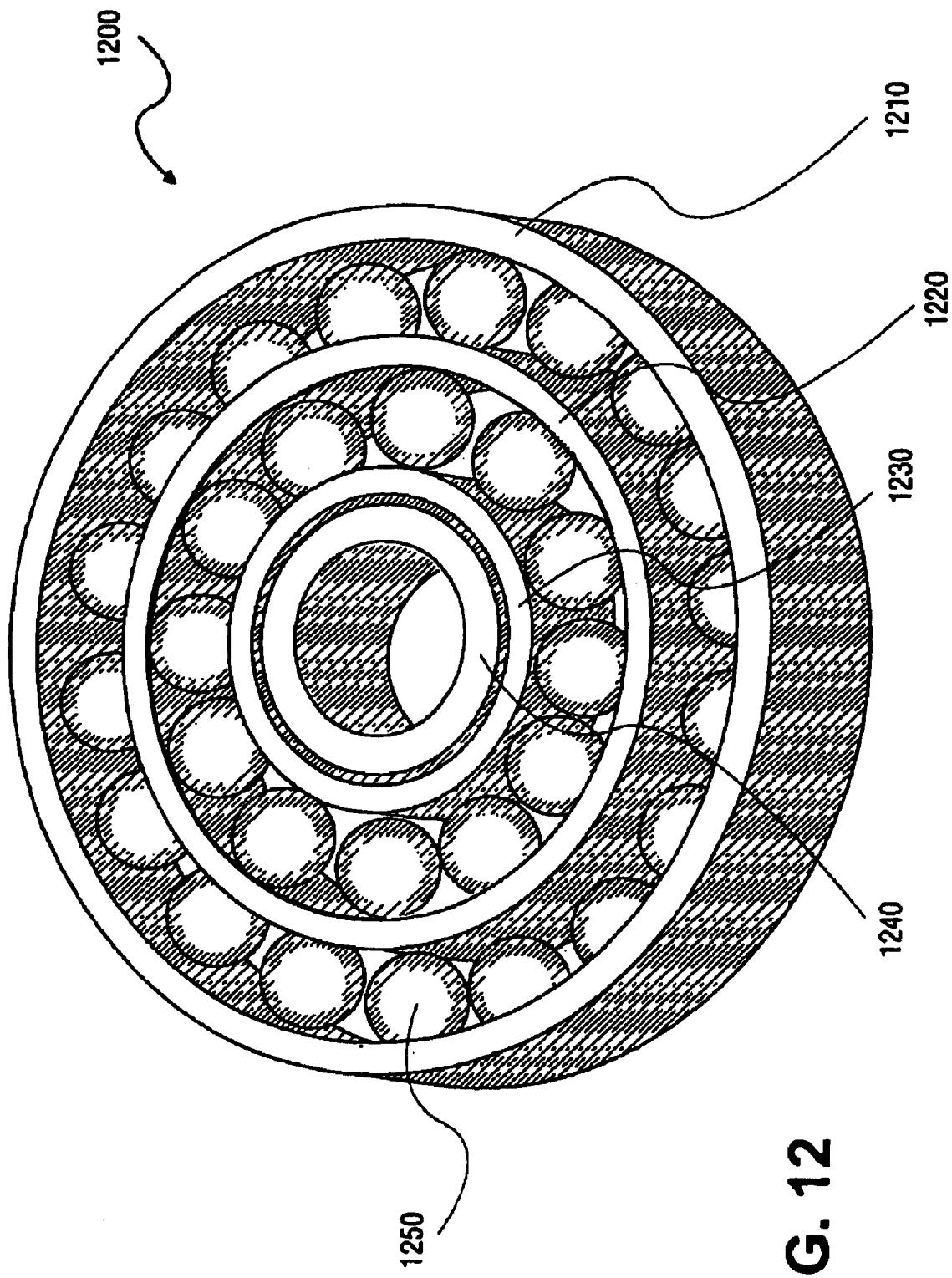
FIG. 12 illustrates an embodiment having a triple redundant bearing.

FIG. 12 illustrates an embodiment having a triple redundant bearing. Triple redundant bearing 1200 includes outer sleeve 1210, middle sleeve 1220, inner sleeve 1230, inner bushing sleeve 1240 and bearing balls 1250. One should note that bearing balls 1250 can be replaced with other bearings means, such as roller bearings, without diverging in scope. As can be seen in FIG. 12, this embodiment has three sets of races and two sets of ball bearings. In this embodiment, if one set of ball bearings fail, the second set will continue with normal operation. Further, if both sets of ball bearings fail, triple redundant bearing 1200 then acts as a standard bushing adding additional life to the device using triple redundant bearing 1200. Also, it should be noted that if any two of the redundancies fail, triple redundant bearing 1200 still continues to perform as a normal bearing.

Triple redundant bearing 1200 can be used in various rotating devices, such as motors, various mechanical devices, wheels, etc. This embodiment can be made of various metal, metal-alloys, synthetic materials, such as hardened plastic, etc. Moreover, this embodiment can be size adjusted, depending on the device incorporating the bearing and size required based on load. Also, further redundancies, i.e., bearing sets, can be added if necessary for the application. When triple redundant bearing 1200 is used in cooling fans, a typical single point failure of a typical bearing is overcome. Therefore, triple redundant bearing 1200 adds life to components needing cooling and to internal fan components, such as the electronics and windings of the fan motor. Thus, cooling redundancy can be achieved without necessitating separate redundant cooling fans. Therefore, it follows that acoustical noise is reduced by having triple redundant bearings incorporated into cooling fans by using a single fan with redundant bearings instead of using multiple separate fan devices for redundancy.

Figure 13:
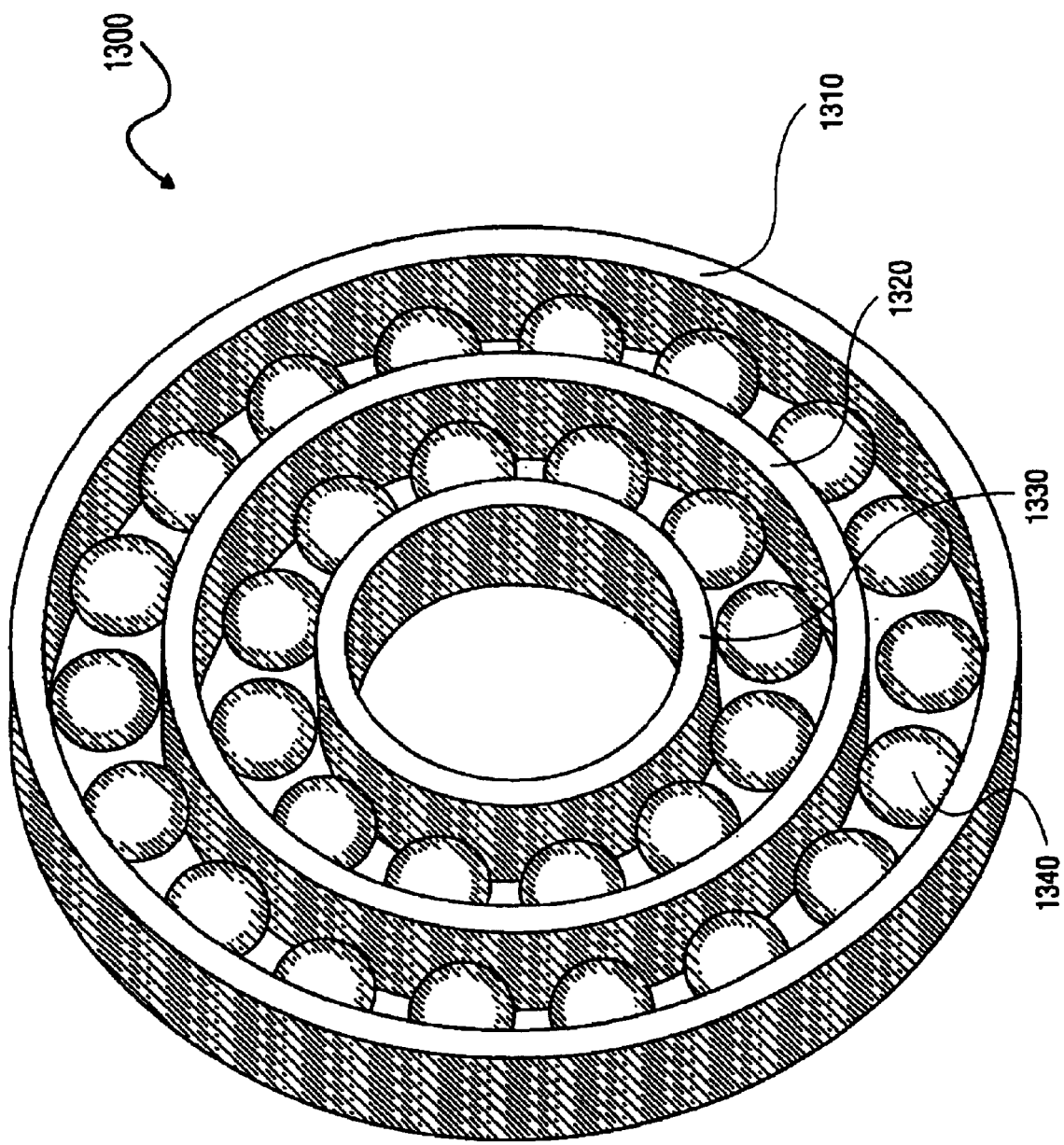
FIG. 13 illustrates an embodiment having a dual redundant bearing.

FIG. 13 illustrates an embodiment having a dual redundant bearing. Dual redundant bearing 1300 includes outer sleeve 1310, middle sleeve 1320, inner bushing sleeve 1330, and bearing balls 1340. One should note that other bearing means, such as roller bearings, can be used instead of bearing balls 1340 without diverging in scope. In this embodiment, there are three sets of sleeves and two sets of ball bearings. If one of the ball bearing sets fails (e.g., seizes due to loss of lubrication, change of ball shape, etc.) the second set will continue with normal operation. By using dual redundant bearing 1300, a device incorporating bearing 1300 can extend its usefulness and/or life span.

Bearing 1300 can be used in various devices such as AC and DC motors, various mechanical devices, wheels, etc. This embodiment can be made of various metal, metal-alloys, synthetic materials, such as hardened plastic, etc. Moreover, this embodiment can be size adjusted, depending on the device incorporating the bearing and size required based on load. Also, further redundancies, i.e., bearing sets, can be added if necessary for the application. When this embodiment is incorporated in a device, such as a cooling fan, the bearing redundancy removes the necessity for having separate cooling fans that are required for redundancy protection. Also, acoustical noise level is reduced by eliminating separate redundant fan devices. By incorporating bearing 1300 into multiple redundant fans (e.g., previously discussed embodiments) single-point failures due to a single bearing failure is overcome.

Figure 14:
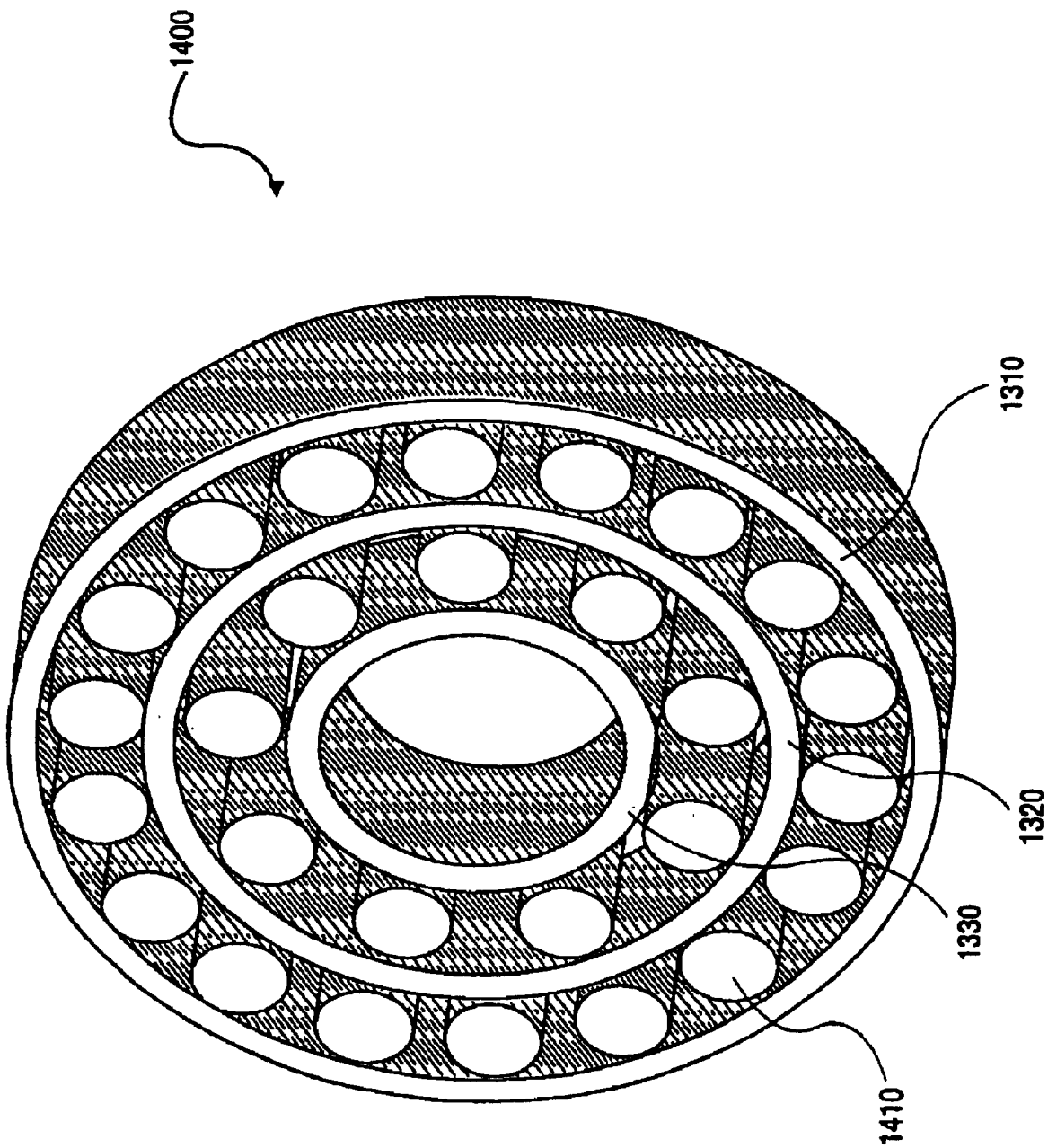
FIG. 14 illustrates an embodiment of a dual redundant bearing having roller bearings.

As noted above, roller bearings can be used instead of ball bearings in the embodiments illustrated in FIGS. 11, 12 and 13. For example, FIG. 14 illustrates the embodiment illustrated in FIG. 13 with the ball bearings replaced with roller bearings 1410. Further, other known bearing means can be used in the place of balls or rollers without diverging from the scope of the embodiments of the invention. Also note that the embodiments illustrated in FIGS. 11, 12, 13 and 14 can be made with various metal, metal alloys, ceramics, synthetic materials, such as hardened plastic, etc. Moreover, these embodiments can be size adjusted, depending on the device incorporating the bearing and required size based on load.

Figure 15:
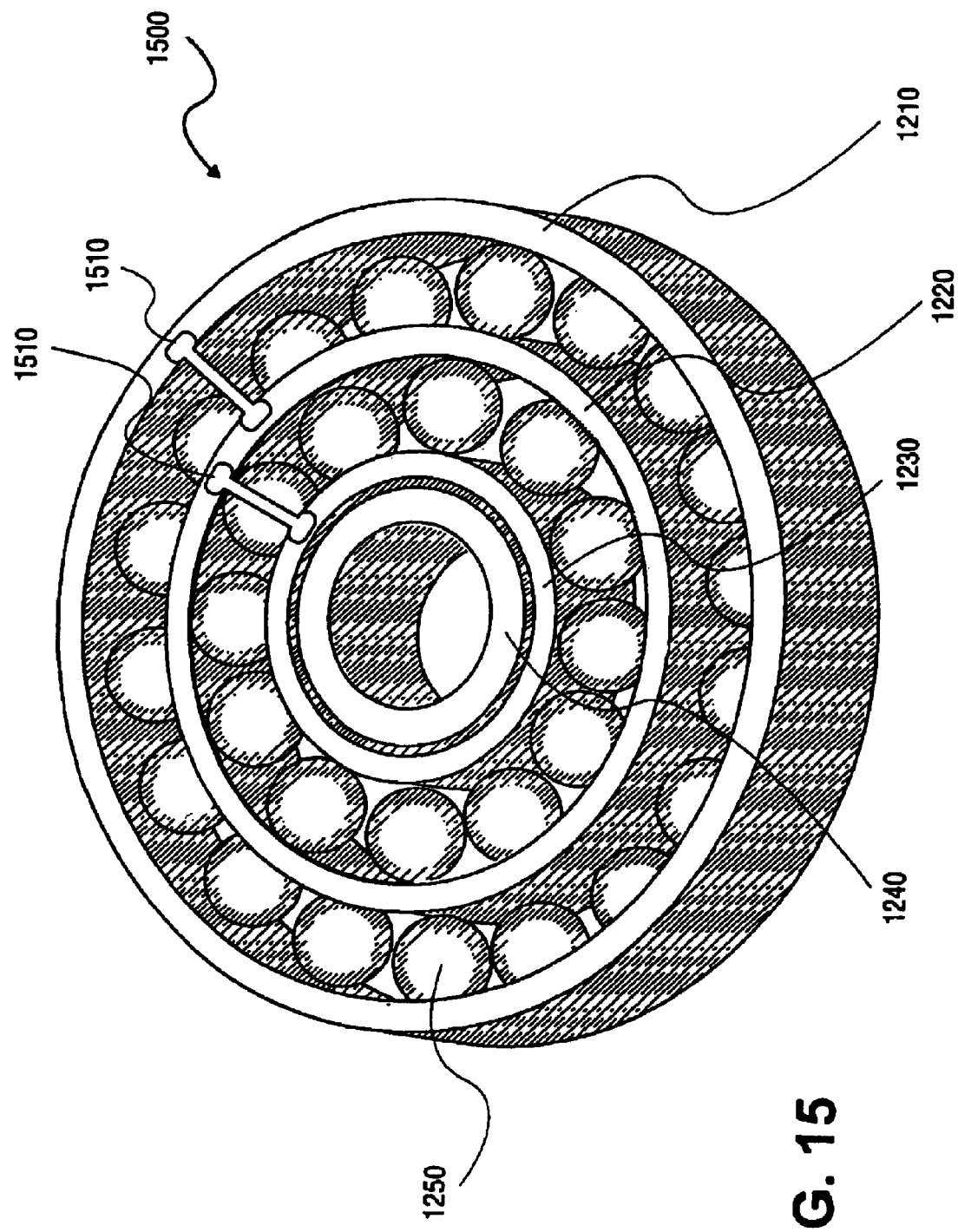
FIG. 15 illustrates an embodiment having redundant sets of bearings and a frangible link.

FIG. 15 illustrates an embodiment having redundant sets of bearings and at least one frangible link. Frangible link 1510 (for example purposes, two frangible links are illustrated in 1500) is added to redundant bearing 1500 to achieve fail over operation rather than parallel redundancy. By using one or more frangible links, control is achieved as to which of the bearing redundancies to use first within a redundant bearing. In this embodiment, a failed bearing will transfer an impulse force to frangible link 1510 due to torque from a shaft, thus, breaking frangible link 1510 and resulting in the spin-up of a redundant bearing. One or more frangible links 1510 can be incorporated with the embodiments illustrated in FIGS. 11–14.

Frangible link 1510 can be attached to a redundant bearing by an adhesive, such as epoxy, using a heat source, such as a weld, etc. Frangible link 1510 can be made from a metal, a metal alloy, a ceramic material, synthetic material, such as a hardened plastic material, etc. Depending upon the use of a redundant bearing, such as redundant bearing 1500, the tensile strength of frangible link 1510 is varied to effect efficient breaking of frangible link 1510 upon one of the redundant bearing sets failing (e.g., shaft torque due to seizing of a bearing because of loss of lubrication, etc.).

Figure 16:
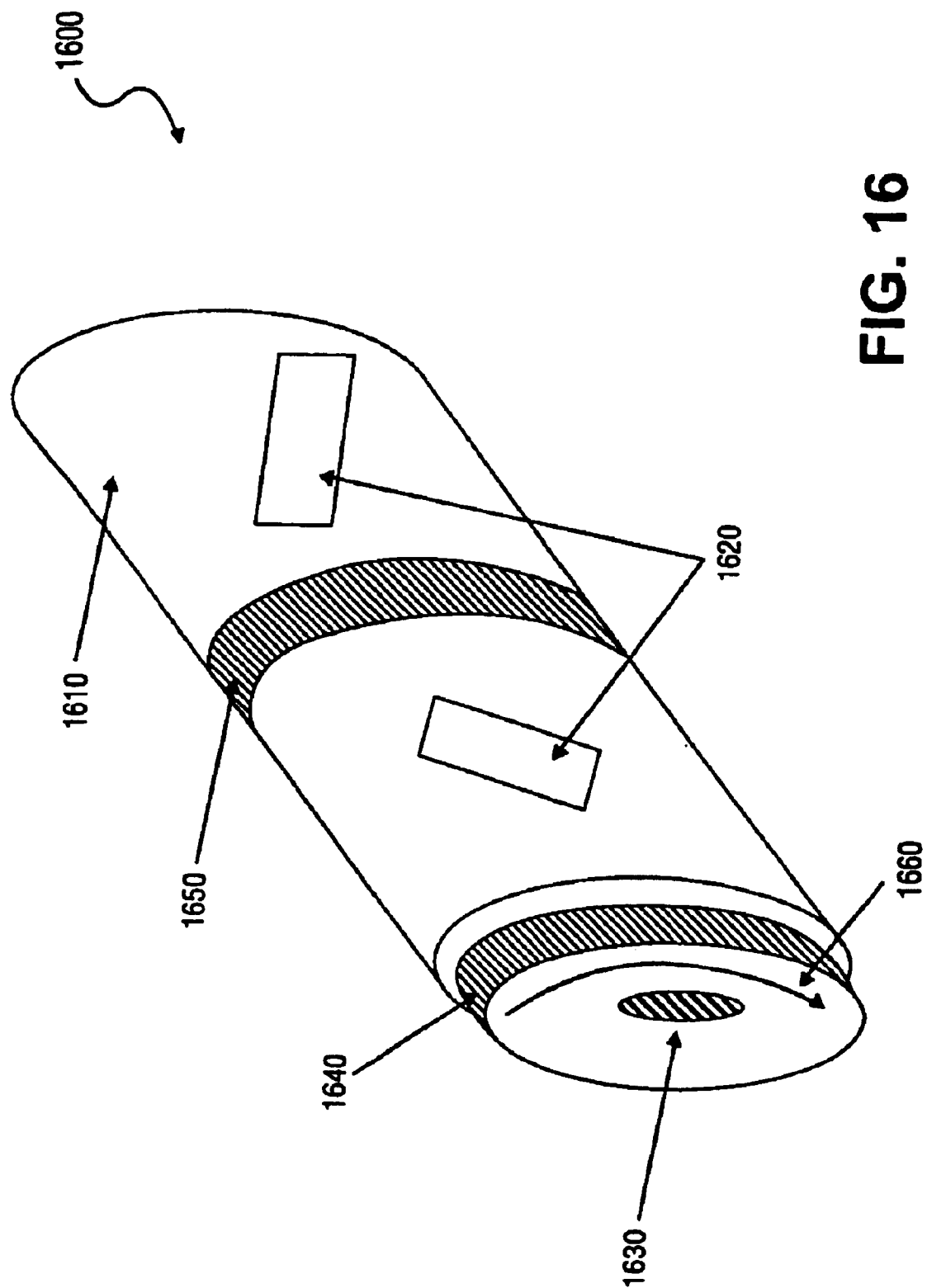
FIG. 16 illustrates an embodiment having a strain gauge to detect bearing failure.

FIG. 16 illustrates an embodiment having at least one strain gauge to detect if a bearing has failed. Device 1600 illustrated in FIG. 16 includes main shaft 1610, strain gauges 1620, bearings 1640 and 1650, and shaft 1630. In this embodiment, at least a single strain gauge is used for each bearing coupled with main shaft 1610. Bearings 1640 and 1650 are inserted into the main sleeve as illustrated in FIG. 16. Bearings 1640 and 1650 are made in such a way as to not slip after placed within the main sleeve.

In one embodiment, bearing 1640 and 1650 have their outer surface knurled to provide a non-slippable contact between bearing 1640 and 1650, and the main sleeve. If one of the bearings fail (i.e., seizes, loses lubrication, deforms, etc.) shaft 1630 will have increased friction against a bearing set. As this friction increases, an increase in torque would be transferred from the shaft to the main sleeve through the failed bearing. Strain gauges 1620 measure the increase in torque and detect if the shaft is rotating inside the bearing. Strain gauges 1620 can output an electrical signal based on the measured varied resistance caused by strain in the device. The signal output from strain gauges 1620 can be used to respond with an alert or event signal. For example, the output from strain gauges 1620 can be used to signal an alarm and shut down the device whose bearing has been sensed to have failed.

A process for detecting bearing failure for this embodiment is as follows. Determine a nominal value from strain gauges 1620 during normal operation. This can be simply collecting transmitted signals from strain gauges 1620 for a set period of time. Determine a tolerance level for an allowable difference between the normal operation of bearing 1640 and 1650 and a problem, such as additional friction caused from a failing bearing. With redundant bearings, a ratio of bearing sets to each other can be determined. Therefore, a difference if any, between an output of strain gauges 1620 for each bearing set ran can be determined based on the ratio. Transmit a signal from a strain gauges 1620 to a circuit or processor that will keep a running record of received signals for comparison. Upon exceeding the allowable difference between normal operation and a possible problem, transmit a warning signal to a user or circuit. Alternatively, transmit a shutdown signal to a circuit, processor, or device 1600.

In one embodiment, bearing 1640 and 1650 are redundant bearings (i.e., bearings illustrated in FIGS. 11–15). In this embodiment, strain gauges 1620 can sense the change in torque as redundancies fail, e.g. when one of the redundant bearing sets fail. This embodiment also detects when all the redundancies in bearings 1640 and 1650 fail. In this embodiment, output signals from strain gauge 1620 can be used to trigger warnings and to apprise a user or other device that a bearing may soon fail. In response, the device using strain gauge detection can shut down the device before a component fails, such as over heated electronics, overheated motor windings, etc.

In one embodiment, device 1600 is used with a DC cooling fan (e.g., embodiments illustrated in FIGS. 1, 2, 7 and 9). In this embodiment, besides having multiple redundancies (i.e., redundant electronics, windings and/or magnetic lobes, motors and bearings). Device 1600 is incorporated to detect changes in torque along the shaft in order to warn of impending or complete bearing failure. In this embodiment, the output signals from strain gauges 1620 can be transmitted to a device, such as processor, server, circuit, etc., and a warning signal can be transmitted to a user (s). Alternatively, the output signals from strain gauges 1620 can be transmitted to a device such as processor, server, circuit, etc., and a shutdown procedures can be initiated. For example, if it is known that a bearing has or soon will fail (based on output signals from strain gauges 1620), a "soft" shut-down process can occur wherein a device or system can be brought down slowly without having components failing due to a "hard" shut down, or excessive heat buildup caused by a failing fan system.

Figure 17A:
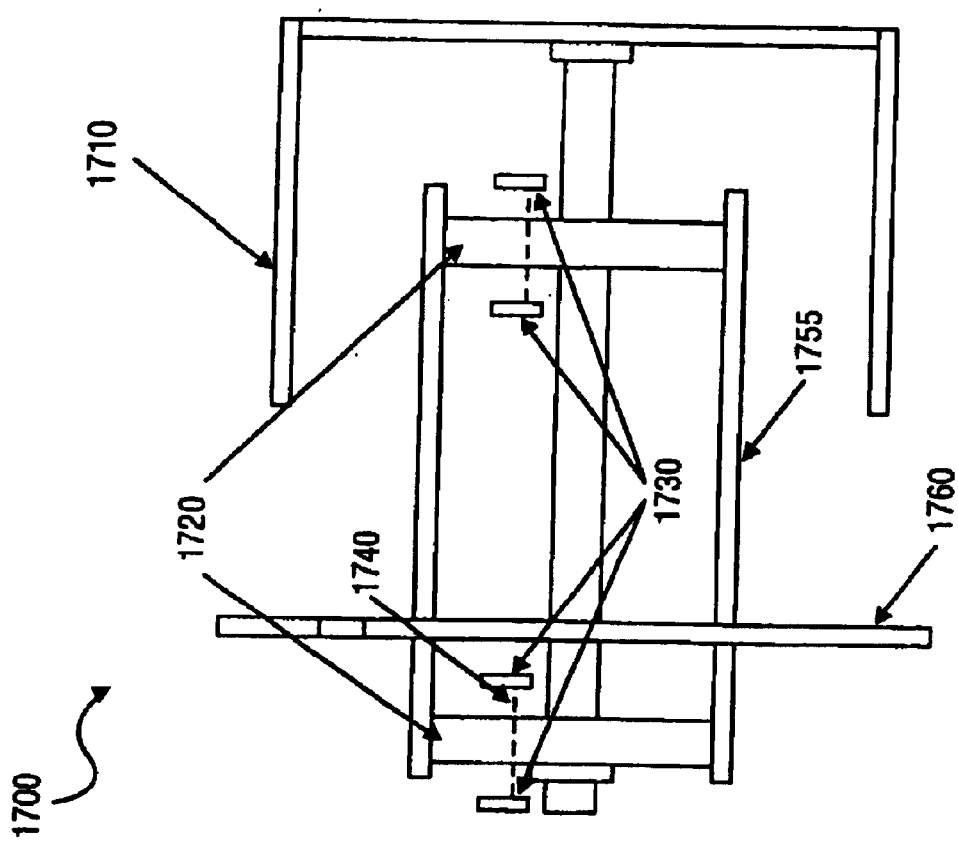
FIG. 17A illustrates an embodiment having optical sensors to detect bearing failure.

FIG. 17A illustrates an embodiment using optical emitter/receiver (or optical emitter/sensor) devices to detect bearing failure. Device 1700 includes emitter/receiver 1730, optical beams 1740 (transmitted/received by emitter/receiver 1730), hub 1710, bearings 1720, main sleeve 1755, shaft 1750, and printed circuit board (PCB) 1760. Emitter/receiver 1730 can be receiver/sensors, such as photoelectric sensors, low powered lasers, photoelectric emitters, etc. Emitter/receivers 1730 are coupled between each inner sleeve of bearing 1720. The purpose of Emitter/receiver 1730 is to detect a change in angular velocity of an inner sleeve of bearing 1720.

Figure 17B:
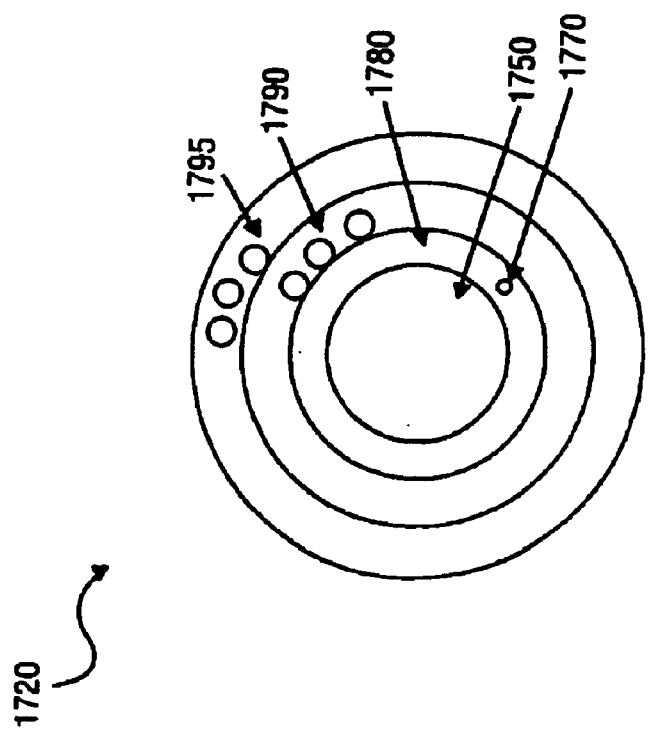
FIG. 17B illustrates a bearing a having light hole.

FIG. 17B illustrates a redundant bearing having light hole 1770 in bearing sleeve 1780. When an optical emitter (emitter/receiver 1730) emits an optical beam, as bearing 1720 rotates about shaft 1750 a portion of the beam transmits through light hole 1770 and is received on the opposite optical receiver 1740. When one of the redundant bearing sets in bearing 1720 fails, a change in angular velocity can be detected by determining the difference in angular velocity based on receiver/sensors 1730 sensing a change in the sensed light beam. A processor or circuit compares the angular velocity for a set period (such as every two seconds, every ten seconds, etc.). If the angular velocity between periods changes, and the processor senses that fan speed has not changed (based on a set tolerance determined from redundancy ratios, etc.), a warning signal can be transmitted to users or other devices informing of bearing failure or possible bearing failure about to occur. Alternatively, a soft shut down signal can be issued by the processor or circuit for which the device connected with device 1700 and/or any other connected devices can be shut down without harm to any electronic components.

A process for detecting bearing failure for this embodiment is as follows. A light is emitted through light hole 1770 in a bearing 1720 coupled with shaft 1750. The emitted light (light beams 1740) is received through light hole 1770 at emitter/receiver 1730. Emitter/receiver 1730 transmits signals based on the received light. A circuit or processor determines if the bearing has a failure. The failure is detected by determining rotation rate of shaft 1750 and of bearing

1720. The rotation rate of shaft 1750 is compared with the rotation rate of bearing 1720. If there is no difference in rotation rate (i.e., the bearing is failed), or there is a slight difference (based on a normal known difference), a signal is transmitted from the circuit/processor to a user or other circuit/processor. Alternatively, a shutdown signal can be transmitted to shutdown a device before harm is done by improper cooling.

In the case where device 1700 is incorporated in one of the embodiments illustrated in FIGS. 1, 2, 7 and 9, by using this embodiment, electronic components can be saved from overheating due to a failed bearing incorporated within a cooling fan. It should be noted that bearings 1720 can be used in non-redundant bearings where a light hole is placed on the outer or inner sleeve of a single bearing. In this case, as the bearing begins to fail, emitter/receiver 1730 can signal to a circuit or processor of the impending or complete bearing failure.

Figure 18A:
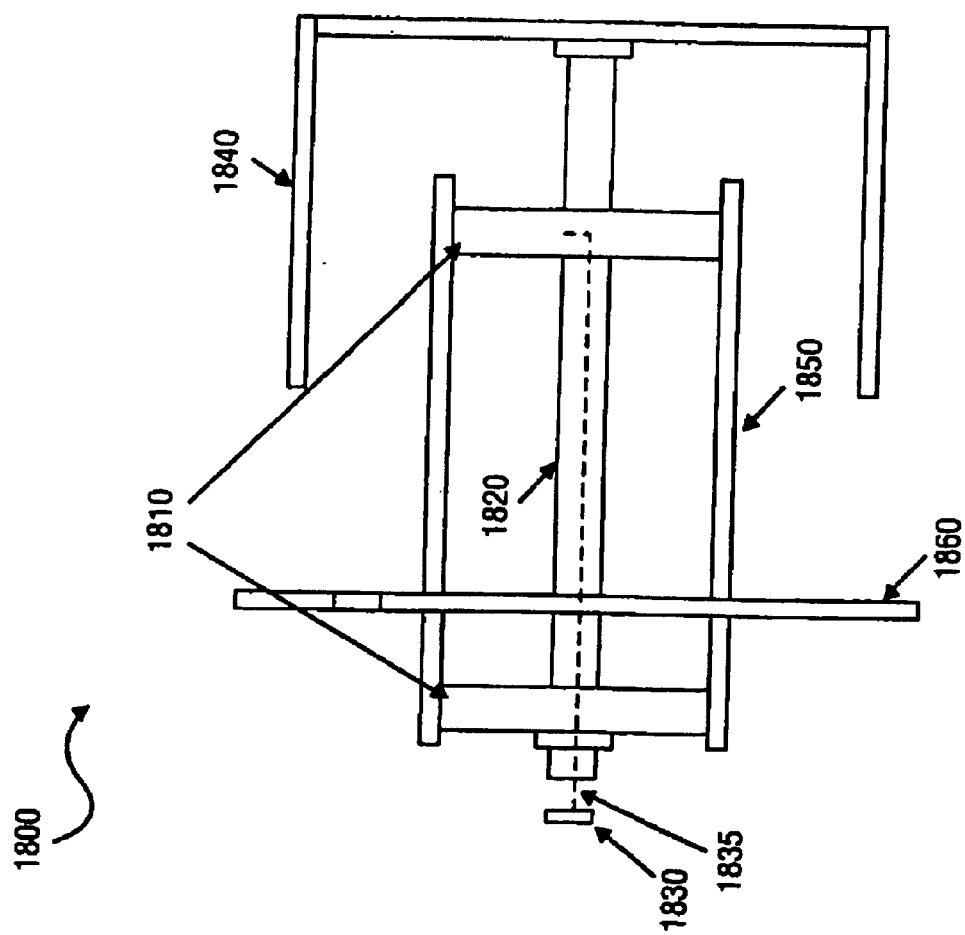
FIG. 18A illustrates another embodiment used to detect bearing failure.

FIG. 18A illustrates device 1800 used to detect variations in angular velocity of inner sleeves on bearings. Device 1800 includes hub 1840, bearings 1810, shaft 1820, sensor/emitter 1830, PCB 1860 and main sleeve 1850. In this embodiment, a light pipe is inserted into shaft 1820 to transmit an optical beam (illustrated as 1835) to bearings 1810. In this embodiment, a small opening is made into shaft 1820 within the diameter of bearings 1810. Through this opening, a light beam from sensor/emitter 1840 can be transmitted/received at sensor/emitter 1830.

Figure 18B:
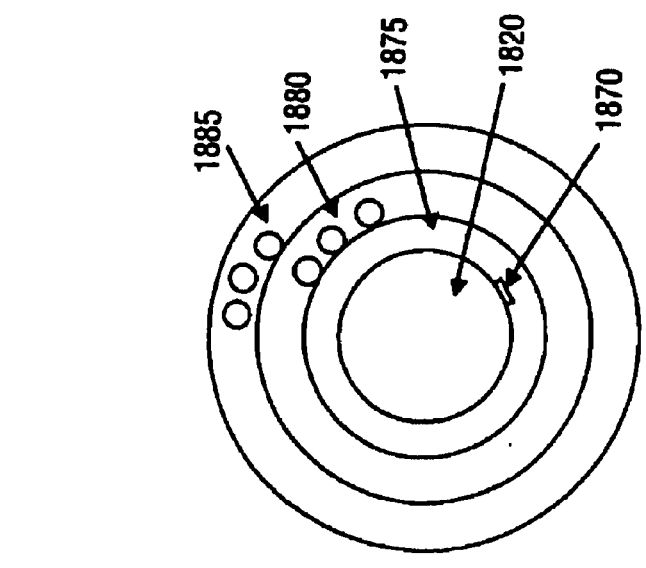
FIG. 18B illustrates a bearing having a reflective surface marker.

FIG. 18B illustrates bearings 1810 having reflective surface marker 1870 coupled with an inner sleeve of bearing 1810. Reflective surface marker 1870 can be a reflective coating on a small portion of the inner sleeve, be formed as part of the inner sleeve, or other technique to coupled reflective surface marker 1870 to the inner surface of the inner sleeve (the surface that couples bearing 1810 to shaft 1820). Reflective surface marker 1870 can be any reflective marker, such as a black stripe, a colored stripe (paint or adhesively applied), different metal-alloy from the inner bearing sleeve that is compatible with the inner bearing sleeve, photo activated marker (paint or adhesively applied), etc. As bearing 1810 rotates about shaft 1820 sensor/emitter 1830 transmits an optical beam through the inserted light pipe, which reflects off reflective surface marker 1870 as bearing 1810 rotates. Upon bearing 1810 failing, angular velocity of the bearing will change as compared to the shaft. The angular velocity sensed from the light pipe to sensor/emitter 1830 is compared with a shaft tachometer (not shown). If there is a difference in angular velocity between the shaft and the reflective surface section sensed by sensor/emitter 1830, a circuit or processor will transmit a signal indicating that the bearing 1810 is about to fail. Once it is known that bearing 1810 is about to fail, a warning signal can be sent to users or devices. Alternatively, a shutdown sequence can be initiated. One should note that bearing 1810 can be a non-redundant bearing or redundant bearing as illustrated in FIGS. 11–15.

A process for detecting bearing failure for this embodiment is as follows. A light (light beam 1835) is emitted by sensor/emitter device 1830 through a light pipe inserted through shaft 1820. Reflected light is received after being reflected by reflective marker 1870 situated on bearing 1810. Signals are transmitted from sensor/emitter device 1830 based on the received reflected light. It is then determined whether a bearing failure has occurred. The detection of bearing failure is as follows. Rotation rate of shaft 1820 and bearing 1810 is determined by a circuit or processor based on received signals from sensor/emitter device 1830. The rotation rate of shaft 1820 is compared with the rotation rate of bearing 1810 by the circuit or processor. If there is any difference (based on a normal known difference), a signal is transmitted from the circuit/processor to a user, device or processor. Alternatively, a shutdown signal can be transmitted to shutdown a device before harm is done by improper cooling.

Figure 19A:
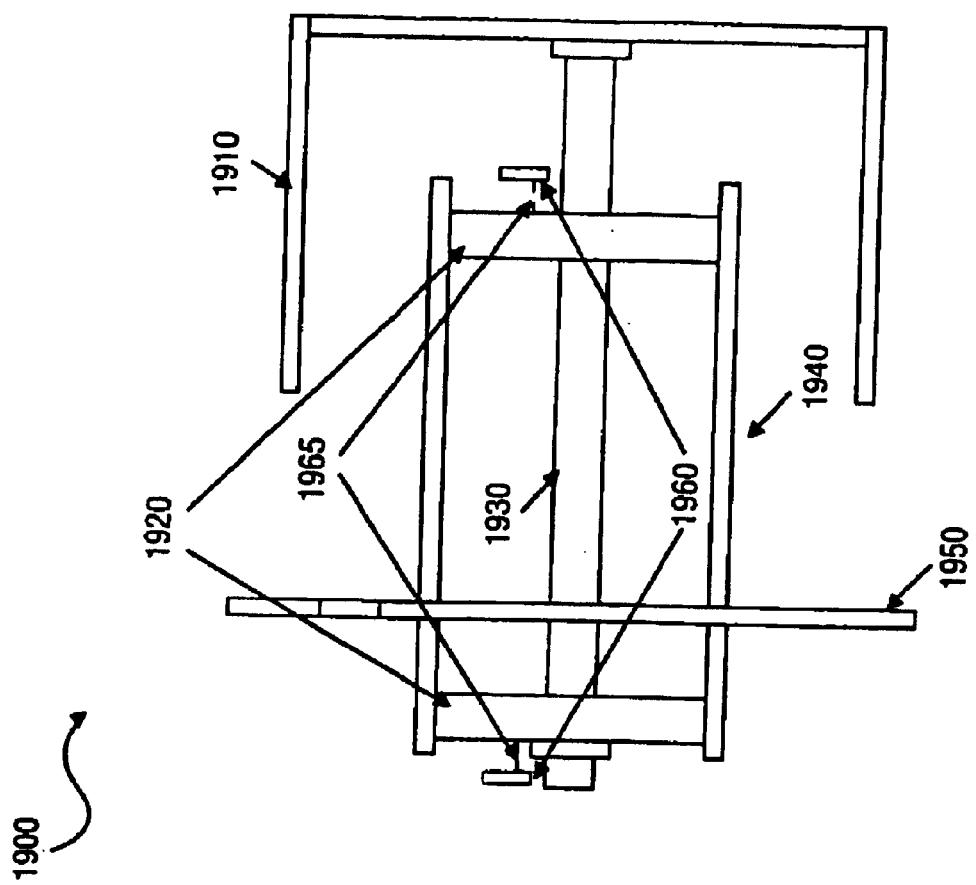
FIG. 19A illustrates yet another embodiment that detects bearing failure.

FIG. 19A illustrates an embodiment that detects variations in angular velocity between a shaft and a bearing. Device 1900 includes hub 1910, bearings 1920, shaft 1930, main sleeve 1940, PCB 1950 and sensor/emitters 1960. Bearings 1920 can be non-redundant bearings or redundant bearings such as those illustrated in FIGS. 11–15.

Figure 19B:
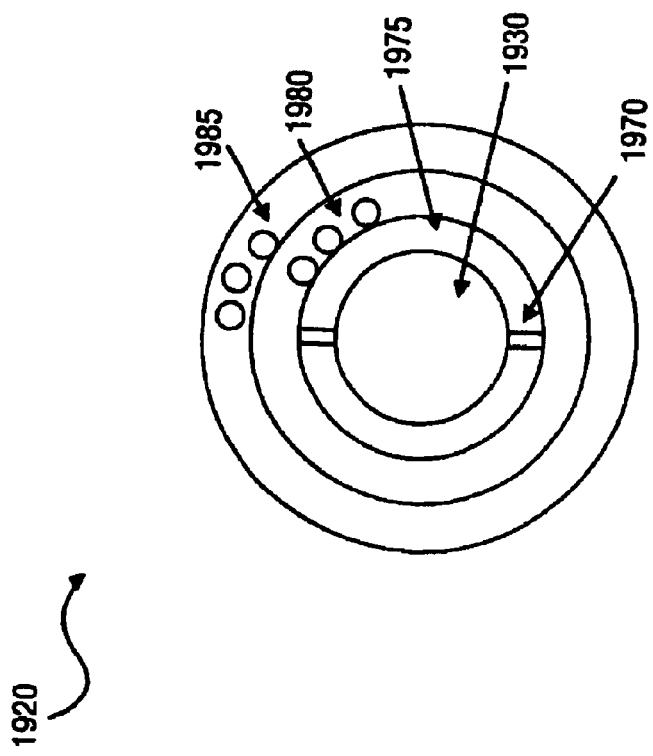
FIG. 19B illustrates a bearing having reflective markers coupled to one side of the bearing.

FIG. 19B illustrates bearings 1920. Bearings 1920 include a reflective surface marker 1970 used to reflect light emitted by sensors/emitter 1960 and received back at sensor/emitter 1960. Reflective surface marker 1970 can be any reflective marker, such as a black stripe, a colored stripe (paint or adhesively applied), different metal-alloy from the inner bearing sleeve that is compatible with the inner bearing sleeve, photo activated marker (paint or adhesively applied), etc. Sensors/emitter s are placed such that beam 1965 is targeted at the reflective surface marker 1970. Bearings 1920 have an outer surface to prevent bearing 1920 to slip once coupled with main sleeve 1940.

During normal operation, the inner race rate per minute (RPM) matches shaft 1930's RPM. If bearing 1920 fails or begins to fail, shaft 1930 will begin to rotate inside the inner bearing race. Sensor/emitter 1960 detects a change in RPM on the inner race. The difference in RPM between shaft 1930 and inner race 1975 of bearing 1920 is the measurement of how effectively the bearing is working. Once a difference in RPM between shaft 1930 and bearing 1920 is detected by sensor/emitter 1960 (coupled to a circuit or processor) a warning signal or shutdown signal can be transmitted in order to prevent possible harm.

It should be noted, that a tachometer or similar device is coupled to shaft 1930, wherein the RPMs of shaft 1930 are accumulated and transmitted to a circuit or processor to determine a difference in RPM between the shaft and the inner race 1975. In one embodiment, device 1900 is incorporated into a fan such as that illustrated in FIGS. 1, 2, 7 and 9. In this embodiment, a fan tachometer is coupled with a fan speed controller. The fan speed controller and sensor/emitter 1960 coupled with a processor or circuit that checks for a difference in RPMs. A small tolerance can be used as a threshold value, or a difference greater than zero can be used for a set period, such as every 10 seconds, 20 seconds, etc.

A process for detecting bearing failure for this embodiment is as follows. A light is emitted by sensor/emitter device 1960 on reflective marker 1970 located on a sleeve of bearing 1920. Reflected light is received after being reflected by reflective marker 1970 situated on the bearing sleeve. Signals are transmitted from sensor/emitter device 1960 based on the received reflected light. It is then determined whether a bearing failure has occurred. The detection of bearing failure is as follows. Rotation rate of shaft 1930 and bearing 1920 is determined by a circuit or processor based on received signals from sensor/emitter device 1960. The rotation rate of shaft 1930 is compared with the rotation rate of bearing 1920 by the circuit or processor. The rotation rate of shaft 1930 is determined by a tachometer coupled with shaft 1930. Output signals from the tachometer are transmitted to the circuit or processor. If there is no difference in rotation rate (i.e., the bearing is failed), or there is a slight difference (based on a normal known difference), a signal is transmitted from the circuit/processor to a user, device or processor. Alternatively, a shutdown signal can be transmitted to shutdown a device before harm is done by improper cooling.

Figure 20:
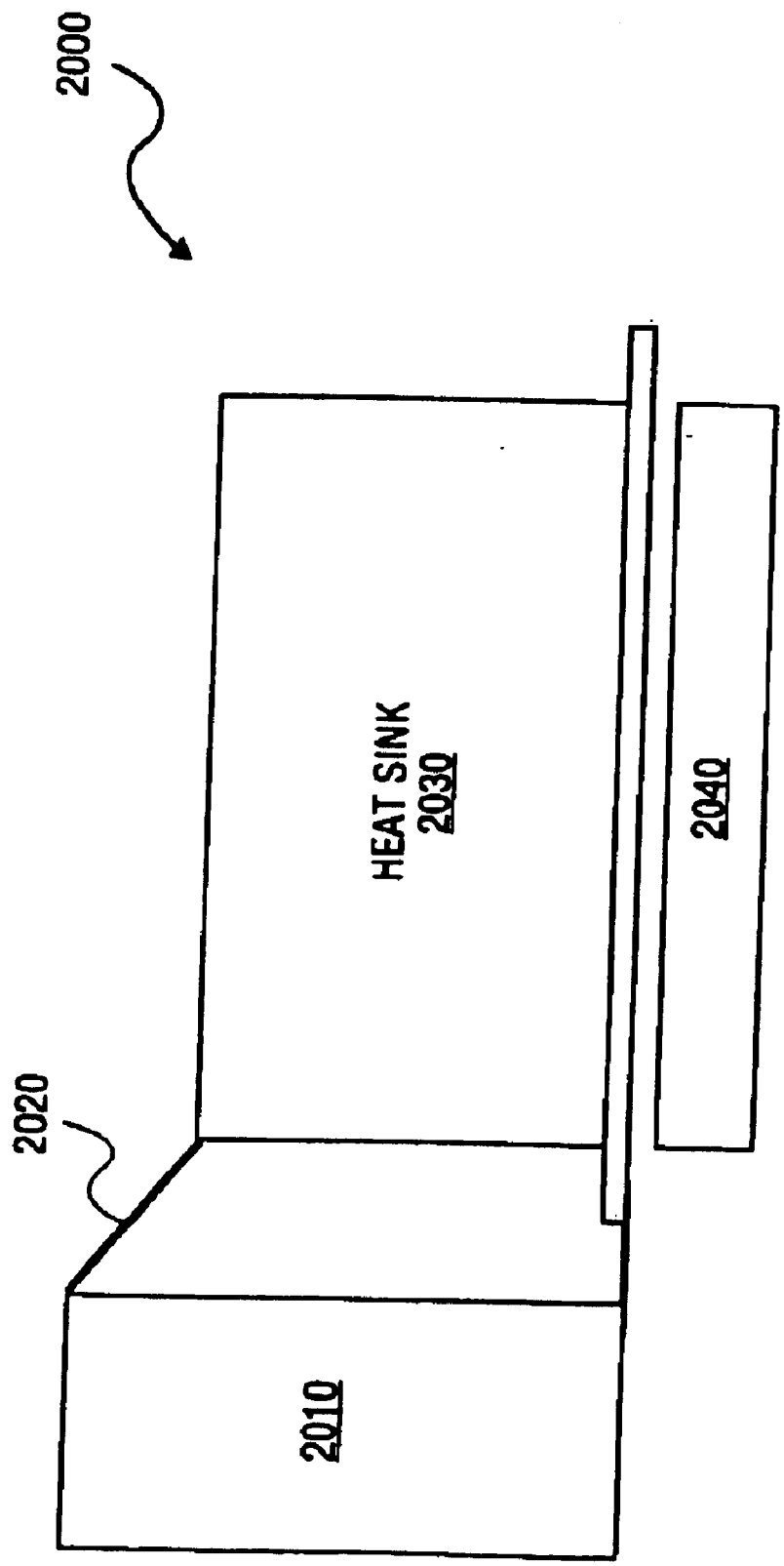
FIG. 20 illustrates an embodiment having a heat sink coupled to a multiple redundant fan.

FIG. 20 illustrates an embodiment having a heat sink coupled with a multiple redundant fan 2010. Device 2000 includes multiple redundant fan 2010, multiple redundant fan adapter 2020, and heat sink 2030. Multiple redundant fan 2010 can be a fan such as that illustrated in FIGS. 1, 2, 7 and 9. In this embodiment, heat sink 2030 is also coupled with a processor (or multi-processor) 2040. Multiple redundant fan 2010 can operate at low RPMs since it is used to bring in fresh air over/through heat sink 2030.

In one embodiment, multiple redundant fan 2010 and heat sink 2030 is attached to a multi-processor 2040 that resides in a server system. In this embodiment, due to the redundancy of fan 2010, less maintenance is required due to the redundancies. Further, acoustical noise is reduced since a reduced number of fans are needed to maintain cooling redundancy. Further, less space is required to house a server or system needing cooling redundancy. Moreover, electromagnetic interference (EMI) containment is increased by having reduced apertures for cooling in server chassis.

While certain exemplary embodiments have been described and shown in the accompanying drawings, it is to be understood that such embodiments are merely illustrative of and not restrictive on the broad invention, and that this invention not be limited to the specific constructions and arrangements shown and described, since various other modifications may occur to those ordinarily skilled in the art.

What is claimed is:

1. A method comprising:

determining nominal value for at least one strain gauge;

determine tolerance value for friction of at least one bearing;

measuring torque of a main shaft with the at least one strain gauge;

transmitting a signal to a device, said device keeping history of received signals; and transmitting one of a warning signal and a shutdown signal if the tolerance value is exceeded.

2. The method of claim 1, wherein said at least one bearing is a redundant bearing.

3. The method of claim 1, wherein increased friction of said at least one bearing is detected and complete failure can be avoided due to said transmitting of one of said warning signal and said shutdown signal.

4. An apparatus comprising:

a first shaft and a second shaft, a plurality of bearings coupled with a sleeve and the first and second shafts, a plurality of strain gauge devices coupled to the sleeve, wherein each strain gauge device is situated between two of the plurality of bearings, and a circuit that receives signals transmitted by said plurality of strain gauge devices, said circuit determines when a predetermined nominal value for each of said plurality of strain gauge devices is exceeded and transmits one of a warning signal and a shutdown signal upon exceeding said nominal value.

5. The apparatus of claim 4, wherein each bearing of the plurality of bearings has a non-slip outer surface coupled with the sleeve.

6. The apparatus of claim 4, wherein the transmitted signals include failure information for the plurality of bearings.

7. The apparatus of claim 4, wherein each of the plurality of strain gauge devices detect an increase in shaft torque.

8. The apparatus of claim 4, wherein at least one of the plurality of bearings is a redundant bearing.

9. The apparatus of claim 4, wherein a cooling fan is coupled to said second shaft.

10. An apparatus comprising:

a first shaft and a second shaft, a cooling fan coupled to said second shaft, a plurality of bearings coupled with a sleeve and the first and second shafts, and a plurality of strain gauge devices coupled to the sleeve, wherein each strain gauge device is situated between two of the plurality of bearings.

11. The apparatus of claim 10, wherein each bearing of the plurality of bearings has a non-slip outer surface coupled with the sleeve.

12. The apparatus of claim 10, wherein each strain gauge device transmits signals to a circuit, the transmitted signals include failure information for the plurality of bearings.

13. The apparatus of claim 10, wherein each of the plurality of strain gauge devices detect an increase in shaft torque.

14. The apparatus of claim 10, wherein at least one of the plurality of bearings is a redundant bearing.

* * * * *